United States Patent
Azuma et al.

[19]

[11] Patent Number: 6,133,050
[45] Date of Patent: Oct. 17, 2000

[54] UV RADIATION PROCESS FOR MAKING ELECTRONIC DEVICES HAVING LOW-LEAKAGE-CURRENT AND LOW-POLARIZATION FATIGUE

[75] Inventors: Masamichi Azuma; Larry D. McMillan; Carlos A. Paz de Araujo; Michael C. Scott, all of Colorado Springs, Colo.

[73] Assignees: Symetrix Corporation, Colorado Springs, Colo.; Matsushita Electronics Corporation, Japan

[21] Appl. No.: 08/405,885

[22] Filed: Mar. 17, 1995

Related U.S. Application Data

[63] Continuation-in-part of application No. 07/965,190, Oct. 23, 1992, abandoned, and a continuation-in-part of application No. 07/993,380, Dec. 18, 1992.

[51] Int. Cl.[7] ................................................. H01L 21/31
[52] U.S. Cl. ............................. 438/3; 438/785; 427/542; 427/558
[58] Field of Search ..................................... 437/231, 235; 427/553, 542, 558; 438/778, 782, 785, 3, 130

[56] References Cited

U.S. PATENT DOCUMENTS

| | | | |
|---|---|---|---|
| 3,081,200 | 3/1963 | Tompkins et al. | 437/235 |
| 4,437,139 | 3/1984 | Howard | 437/235 |
| 4,485,094 | 11/1984 | Pebler et al. | 437/235 |
| 4,704,785 | 11/1987 | Curran | 437/110 |
| 4,830,983 | 5/1989 | Thornton | 437/161 |
| 4,983,546 | 1/1991 | Hyun et al. | 437/231 |
| 5,028,455 | 7/1991 | Miller et al. | 427/126.3 |
| 5,138,520 | 8/1992 | McMillan et al. | 361/311 |
| 5,146,299 | 9/1992 | Lampe et al. | 357/23.5 |
| 5,156,884 | 10/1992 | Tanitsu et al. | 427/558 |
| 5,160,762 | 11/1992 | Brand et al. | 437/235 |
| 5,310,990 | 5/1994 | Russell et al. | 219/121.69 |
| 5,316,579 | 5/1994 | McMillan et al. | 118/50 |
| 5,423,285 | 6/1995 | Paz de Araujo et al. | 117/90 |
| 5,434,102 | 7/1995 | Watanabe et al. | 437/130 |
| 5,439,845 | 8/1995 | Watanabe et al. | 437/130 |
| 5,456,945 | 10/1995 | McMillan et al. | 427/252 |
| 5,468,679 | 11/1995 | Paz de Araujo et al. | 437/110 |
| 5,514,822 | 5/1996 | Scott et al. | 556/28 |
| 5,519,234 | 5/1996 | Paz de Araujo et al. | 257/295 |
| 5,601,869 | 2/1997 | Scott et al. | 427/126.3 |

FOREIGN PATENT DOCUMENTS

| | | | |
|---|---|---|---|
| 0489519A2 | 6/1992 | European Pat. Off. | 21/314 |
| 2232974 | 9/1990 | Japan | 29/788 |
| 5343642 | 12/1993 | Japan . | |
| 6234551 | 8/1994 | Japan | C03C 17/25 |
| WO94/10084 | 5/1994 | WIPO | C01B 13/32 |
| WO94/10702 | 5/1994 | WIPO | H01L 21/316 |

OTHER PUBLICATIONS

Roozeboom, Fred "Rapid Thermal Processing Systems: A Review With Emphasis on Temperature Control", J. Vac. Sci. Technol, B8(6), Nov./Dec. 1990.

(List continued on next page.)

*Primary Examiner*—Charles Bowers
*Assistant Examiner*—Matthew Whipple
*Attorney, Agent, or Firm*—Duft, Graziano & Forest, P.C.

[57] ABSTRACT

A precursor solution formed of a liquid polyoxyalkylated metal complex in as solvent is applied to a substrate in the formation of a metal oxide thin film. The liquid thin film is baked in air to a temperature up to 500° C. while UV radiation having a wavelength ranging from 180 nm to 300 nm is applied. The thin film can be twice-baked at increasing temperatures while UV radiation is applied at one or both bakings. The film is then annealed at temperature ranging from about 700° C. to 850° C. to produce a thin-film solid metal oxide product. Alternatively, the UV radiation may be applied to the liquid precursor, the thin film may be annealed with UV radiation, or combinations of such applications of UV radiation to the precursor, to the thin film before or after baking, and/or UV annealing may be used. The use of UV radiation significantly reduces the leakage current and carbon impurity content of the final metal oxide.

28 Claims, 13 Drawing Sheets

OTHER PUBLICATIONS

Mihara, Takashi, et al., Feasibility for Memory Devices and Electrical Characterization of Newly Developed Fatigue Free Capacitors, 4th Annual Int'l Symposium on Integrated Ferroelectrics, 1992.

Melnick, B.M., et al., "Process Optimization and Charaterization of Device Worthy Sol–Gel Based PZT for Ferroelectric Memories," Ferroelectrics, 1990, vol. 109, Gordon & Breach Science Publishers S.A.

Vest, Robert W., et al., "PbTiO$_3$ Films From Metalloorganic Precursors," IEEE Transactions on Ultrasonics, Ferroelectrics and Frequency Control, vol. 35, No. 6, Nov. 1988.

Smolenskii, G.A., et al., "Ferroelectrics and Related Materials," vol. 3 of Ferroelectricity and Related Phenomena, Gordon & Breach Science Publishers.

Subbarao, E.C., "A Family of Ferroelectric Bismuth Compounds," J. Physical Chem. Solids, Pergamon Press 1962, vol. 23, pp. 665–676.

Shu–Yau–Wu, "A New Ferroelectric Memory Device, Metal–Ferroelectric–Semiconductor Transistor," IEE Transactions on Electron Devices, vol. ED–21, No. 8, Aug. 1974.

Joshi, P.C., et al.; Rapid Thermally Processed Ferroelectric Bi$_4$Ti$_3$O$_{12}$ Thin Films; Journal of Applied Physics, 1992, Dec., No. 11; New York, US.

UV RADIATION PROCESS FOR MAKING ELECTRONIC DEVICES HAVING LOW-LEAKAGE-CURRENT AND LOW-POLARIZATION FATIGUE

RELATED APPLICATIONS

This application is a continuation-in-part of United States application Ser. No. 07/965,190 filed Oct. 23, 1992, now abandoned and application Ser. No. 07/993,380 filed Dec. 18, 1992.

BACKGROUND OF THE INVENTION

1. Field of the Invention

The invention pertains to the fabrication of integrated circuits utilizing metal oxides, such as perovskites and perovskite-like layered superlattice materials, and more particularly to the use of ultraviolet ("UV") radiation in the fabrication of such materials for use in integrated circuits.

2. Description of the Prior Art

Ferroelectric perovskite-like layered superlattice materials are known, and have been reported as phenomenonological curiosities. The term "perovskite-like" usually refers to a number of interconnected oxygen octahedra. A primary cell is typically formed of an oxygen octahedral positioned within a cube that is defined by large A-site metals where the oxygen atoms occupy the planar face centers of the cube and a small B-site element occupies the center of the cube. In some instances, the oxygen octahedra may be preserved in the absence of A-site elements. The reported annealing temperatures for these materials often exceed 1100° C. or even 1300° C., which would preclude their use in many integrated circuits.

Ferroelectric materials can be used in electronic memories. The respective positive and negative polarization states can be used to store information by substituting a ferroelectric material for the dielectric capacitor material of a conventional DRAM capacitor circuit. Still, ferroelectric memory densities are limited by the magnitude of polarization that may be obtained from the ferroelectric material. Prior thin-film ferroelectric materials typically have high polarization fatigue rates that make them unreliable in long term use because the magnitude of polarization decreases with use. Eventually, the control logic that is coupled with known ferroelectric materials will be unable to read the fatigued polarization state of the materials and, therefore, unable to store or retrieve bits of information.

Prior layered superlattice materials typically have high dielectric constants, and can be used as conventional dielectrics. Even so, a high leakage current makes these materials poorly suited for use as a dense dielectric memory because the charged or uncharged state of the dielectric capacitor circuit must be too frequently detected and refreshed. High leakage current and long term reliability currently present a significant obstacle in research toward further densification of integrated circuit memories.

Spin-on liquid deposition processes have been used to make insulators for integrated circuits, such as spin-on glass (SOG), and have also been used for making metal oxides having perovskite structures. See G. M. Vest and S. Singaram, "Synthesis of "Metallo-organic Compounds For MOD Powders and Films", *Materials Research Society Symposium Proceedings, Vol.* 60, 1986, pp. 35–42, *IEEE Transactions On Ultrasonics, Ferroelectrics, and Frequency Control,* Vol 35, No. 6, November 1988, pp. 711–717, and "Metalorganic Deposition (MOD): A Nonvacuum, Spin-on, Liquid-Based, Thin Film Method", *Materials Research Society Bulletin,* October 1989, pp. 48–53. Nevertheless, the quality of the thin films made in these references was too poor for use in integrated circuits.

Ultraviolet radiation has been utilized as an energy source to disassociate hydroxyl bonds in vapor deposition of thin films. See U.S. Pat. No. 5,119,760 issued to two of the present inventors. There has been no indication in the art that the use of UV radiation may be useful in solving the problem of the high leakage current in metal oxide dielectrics such as strontium titanate. Additionally, there has been no indication that UV radiation could be useful in increasing fatigue resistance or the magnitude of polarization obtainable from a metal oxide material having a particular stoichiometric composition.

SUMMARY OF THE INVENTION

The present invention overcomes the problems of high fatigue and high leakage current in electronic memories, such as DRAMs. These improvements derive from a process that uses UV radiation to orient the crystal grains and reduce the carbon content of thin-film metal oxides. The process-derived metal oxides exhibit superior leakage current and polarization fatigue performance.

Broadly speaking, the manufacturing process includes the steps of providing substrate and a liquid precursor solution, applying the precursor to the substrate form a liquid thin film, and treating the liquid thin film to form a solid metal oxide thin film. The treating step includes the application of UV radiation, which reduces the carbon content of the final metal oxide and also serves to orient the metal oxide grains along a given axis.

The metal oxide materials are preferably formed from corresponding liquid precursor solutions that include a plurality of polyoxyalkylated metal moieties in effective amounts for yielding a metal oxide material having a desired stoichiometry upon thermal treatment of the precursor solution. The metal oxides may include perovskites, and more preferably include the perovskite-like layered superlattice materials having a plurality of oxygen octahedra layers separated by a corresponding number of bismuth oxide layers. The most preferred layered superlattice materials include those having different types of oxygen octahedra layers separated by a corresponding number of bismuth oxide layers. For example, the different types of oxygen octahedra layers may include layers having a thickness of one octahedral and layers having a thickness of two octahedra.

The liquid precursor that is used to form the thin film contains a polyoxyalkylated metal complex, such as a metal alkoxide, a metal carboxylate, or a metal alkoxycarboxylate diluted with a compatible solvent to a desired viscosity or molarity. The use of a metal alkoxycarboxylate is preferred due to the formation, in solution and prior to the first annealing step, of at least 5% of the metal-to-oxygen bonds that will exist in the final metal oxide material. Metal alkoxycarboxylates are also preferred due to their resistance against hydrolysis.

The preferred general processes for preparing precursor solutions of the invention are provided in application serial number 08/132,744 filed Oct. 6, 1993, which is hereby incorporated by reference herein, and application Ser. No. 07/965,190, which is hereby incorporated by reference herein. The processes preferably include reacting a metal, such as barium, strontium, tantalum, or titanium, with an alcohol (e.g., 2-methoxyethanol) to form a metal alkoxide, and reacting the metal alkoxide with a carboxylic acid (e.g., 2-ethylhexanoic acid) to form a metal alkoxycarboxylate or metal alkoxide according to one of the generalized formulae

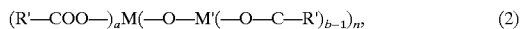

wherein M is a metal having an outer valence of (a+n) and M' is a metal having an outer valence of b, with M and M' preferably being selected from the group consisting of tantalum, calcium, bismuth, lead, yttrium, scandium, lanthanum, antimony, chromium, thallium, hafnium, tungsten, niobium, zirconium, vanadium, manganese, iron, cobalt, nickel, magnesium, molybdenum, strontium, barium, titanium, and zinc; R' is an alkyl group preferably having from 4 to 9 carbon atoms and R is an alkyl group preferably having from 3 to 8 carbon atoms. The precursor is preferably thinned with a xylene solvent prior to use; however, other solvents such as n-butyl acetate or excess 2-ethylhexanoic acid may be utilized. Of course, mixtures of metal alkoxides, metal carboxylates, and metal alkoycarboxylates are acceptable for use as precursor solutions as are the metal alkoxides or metal carboxylates alone. It is preferred that the precursor solutions be distilled at atmospheric pressure to a plateau exceeding 115° C., more preferably exceeding 120° C., and most preferably exceeding about 123° C. This distillation keeps the precursor solution free of water, ethers, light alcohols, and other volatile moieties that can induce cracking of the metal oxide material as well as unwanted polymerization of the solutions.

The treating step may comprise exposing the liquid thin film to a vacuum, baking, annealing or a combination of these actions. The treating step most preferably includes baking the thin film at a moderate temperature of about 200° C. to 500° C. to dry it, and subsequently annealing the precursor at a temperature of from about 500 C. to 1000° C. The most preferred process is one in which the baking or drying step combines UV exposure with steps of baking the substrate and liquid precursor to dry the precursor.

The use of UV radiation stabilizes the ferroelectric properties and reduces the leakage current. Numerous other features, objects and advantages of the invention will become apparent from the following description when read in conjunction with the accompanying drawings.

DETAILED DESCRIPTION OF THE PREFERRED EMBODIMENT

Figure 1:
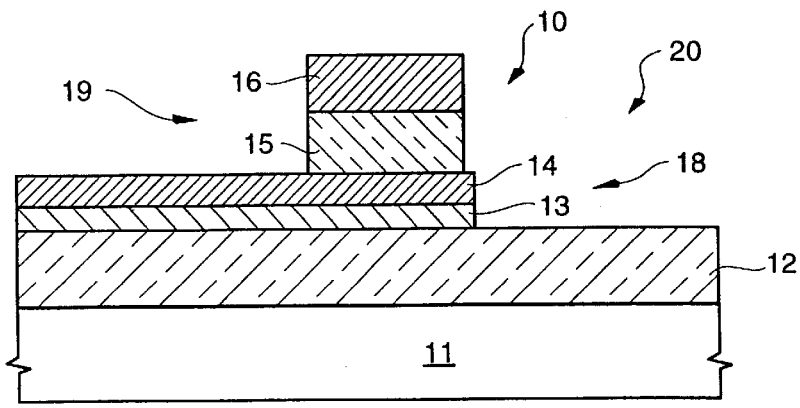
FIG. 1 depicts a cross-sectional view of an integrated circuit capacitor according to the present invention.

FIG. 1 depicts a thin film capacitor 10 that is formed on a substrate including a conventional single crystal silicon wafer 11 having a thick layer 12 of silicon dioxide formed thereon by a conventional oxidation process. An optional adhesion layer 13 of titanium is formed atop layer 12, followed by a first electrode layer 14 of platinum. Layer 13 preferably ranges from 100 Å to 200 Å in thickness. Layer 14 preferably ranges from 1000 Å to 2000 Å in thickness. Both layers 13 and 14 are preferably formed by conventional atomic sputtering techniques, such as DC magnetron sputtering or radio frequency sputtering.

A thin-film metal oxide layer 15 is formed of a material that is preferably a metal oxide having dielectric and/or ferroelectric properties. The metal oxide layer 15 is fabricated as described in detail below and is preferably less than about 4000 Å thick, and most preferably about 2000 Å thick. Layer 15 may be a perovskite, such as barium strontium titanate or strontium titanate. Layer 15 is more preferably a layered superlattice material, and is most preferably a mixed layered superlattice material.

The term "perovskite" herein includes a known class of material having the general form $ABO_3$ where A and B are cations and O is an oxygen anion component. This term is intended to include materials where A and B represent multiple elements; for example, it includes materials of the form $A'A\Delta BO_3$, $AB'B''O_3$, and $A'A''B'B''O_3$, where A', A", B' and B" are different metal elements. Preferably, A, A', A", are metals selected from the group of metals consisting of Ba, Bi, Sr, Pb, Ca, and La, and B, B', and B" are metals selected from the group consisting of Ti, Zr, Ta, Mo, W, and Nb. The terms A-site and B-site refer to specific positions in the perovskite oxygen octahedral lattice.

Layered superlattice materials have a plurality of perovskite-like oxygen octahedra layers separated by a corresponding number of bismuth oxide layers. Layered superlattice materials are typically ferroelectric materials, though, not all such materials may exhibit ferroelectric behavior at room temperature. These materials normally have high dielectric constants, and are useful in high dielectric constant capacitors, whether or not they are ferroelectric.

Especially preferred layered superlattice materials include mixed layered perovskite-like materials, which have different types of oxygen octahedra structures. For example, a first oxygen octahedra layer having a thickness of one octahedral may be separated by a bismuth oxide layer from an oxygen octahedra layer having a thickness of two octahedra. The mixed materials may also include a mixture of layers having respective thicknesses of two and three octahedra, or three and four octahedra.

All types of layered superlattice materials may be generally summarized under the average empirical formula:

$$A1_{w1}^{+a1} A2_{w2}^{+a2} \ldots Aj_{wj}^{+aj} S1_{x1}^{+s1} S2_{x2}^{+s2} \ldots Sk_{xk}^{+sk} B1_{y1}^{+b1} B2_{y2}^{+b2} \ldots Bl_{yl}^{+bl} Q_z^{-2}. \quad (3)$$

Note that Formula (3) refers to a stoichiometrically balanced list of superlattice-forming moieties. Formula (3) does not represent a unit cell construction, nor does it attempt to allocate ingredients to the respective layers. In Formula (3), A1, A2 . . . Aj represent A-site elements in a perovskite-like octahedral structure, which includes elements such as strontium, calcium, barium, bismuth, lead, and mixtures thereof, as well as others metals of similar ionic radius. S1, S2 . . . Sk represent superlattice generator elements, which preferably include only bismuth, but can also include trivalent materials such as yttrium, scandium, lanthanum, antimony, chromium, and thallium. B1, B2 . . . Bl represent B-site elements in the perovskite-like structure, which may be elements such as titanium, tantalum, hafnium, tungsten, niobium, vanadium, zirconium, and other elements, and Q represents an anion, which preferably is oxygen but may also be other elements, such as fluorine, chlorine and hybrids of these elements, such as the oxyfluorides, the oxychlorides, etc. The superscripts in Formula (3) indicate the valences of the respective elements. The subscripts indicate the number of atoms of a particular element in the empirical formula compound. In terms of the unit cell, the subscripts indicate a number of atoms of the element, on the average, in the unit cell. The subscripts can be integer or fractional. That is, Formula (3) includes the cases where the unit cell may vary throughout the material, e.g. in $Sr_{.75}Ba_{.25}Bi_2Ta_2O_9$, on the average, 75% of the time Sr is the A-site atom and 25% of the time Ba is the A-site atom. If there is only one A-site element in the compound then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although Formula (3) is written in the more general form because the invention is intended to include the cases where either of the A and B sites and the superlattice generator can have multiple elements. The value of z is found from the equation:

$$(a1w1+a2W2 \ldots +ajwj)+(s1x1+s2x2 \ldots +skxk)+(b1\ y1+b2y2 \ldots +bjyj)=2z. \quad (4)$$

The layered superlattice materials do not include every material that can be fit into Formula (3), but only those ingredients which spontaneously form themselves into a layer of distinct crystalline layers during crystallization. This spontaneous crystallization is typically assisted by thermally treating or annealing the mixture of ingredients. The enhanced temperature facilitates ordering of the superlattice-forming moieties into thermodynamically favored structures, such as perovskite-like octahedra.

The term "superlattice generator elements" as applied to S1, S2 . . . Sk, refers to the fact that these metals are particularly stable in the form of a concentrated metal oxide layer interposed between two perovskite-like layers, as opposed to a uniform random distribution of superlattice generator metals throughout the mixed layered superlattice material. In particular, bismuth has an ionic radius that permits it to function as either an A-site material or a superlattice generator, but bismuth, if present in amounts less than a threshold stoichiometric proportion, will spontaneously concentrate as a non-perovskite-like bismuth oxide layer.

The term layered superlattice material herein also includes doped layered superlattice materials. That is, any of the material included in Formula (3) may be doped with a variety of materials, such as silicon, germanium, uranium, zirconium, tin, chromium, dysprosium, or hafnium.

Formula (3) at least includes all three of the Smolenskii-type ferroelectric layered superlattice materials, namely, those having the respective empirical formulae:

$$A_{m-1}S_2B_mO_{3m+3}; \tag{5}$$

$$A_{m+1}B_mO_{3m+1}; \text{ and} \tag{6}$$

$$A_mB_mO_{3m+2}, \tag{7}$$

wherein A is an A-site metal in the perovskite-like superlattice, B is a B-site metal in the perovskite-like superlattice, S is a trivalent superlattice-generator metal such as bismuth or thallium, and m is a number sufficient to balance the overall formula charge. Where m is a fractional number, the overall average empirical formula provides for a plurality of different or mixed perovskite-like layers. Formula (7) is most preferred.

The most preferred layered perovskite-like materials are referred to herein as "mixed layered superlattice materials." This term is introduced because no suitable commonly accepted word or phrase exists to describe these materials. Mixed layered superlattice materials are hereby defined to include metal oxides having at least three interconnected layers that respectively have an ionic charge: (1) a first layer ("A/B layer") that can contain an A-site metal, a B-site metal, or both an A-site metal and a B-site metal, which A/B layer may or may not have a perovskite-like oxygen octahedral lattice; (2) a superlattice-generating layer; and (3) a third layer ("AB layer") that contains both an A-site metal and a B-site metal, which AB layer has a perovskite-like oxygen octahedra lattice that is different from the A/B layer lattice. A useful feature of these materials is the fact that an amorphous solution or a non-ordered single mixture of superlattice-forming metals, when heated in the presence of oxygen, will spontaneously generate a thermodynamically-favored layered superlaftice.

The mixed layered superlattice materials include at least three different types of ionic layers. The simplest case is one in which there is a single type of superlattice-generator layer G and two different types of oxygen octahedra layers, namely, $L_1$ and $L_2$ (A/B and AB layers). The octahedra layers are separated from one another by the superlattice-generator layers. Accordingly, any random sequence of collated perovskite-like layers may be observed with intervening G layers, e.g., $$GL_1GL_1GL_2GL_1GL_2GL_2G. \tag{8}$$

$L_1$ differs from $L_2$ in the structure of ionic subunit cells that are the building blocks of the respective layers. The $L_1$-structure (A/B) layers will form a percentage of the total number of perovskite-like layers. This percentage may also be viewed as a concentration-derived probability $\delta$ of finding a given type of L layer interposed between any two G layers. The total of $\delta$ probabilities equals one, and these probabilities are mutually exclusive for a given layer. Layers $L_1$ and $L_2$ may also have a plurality of structurally equivalent A-site moieties or a plurality of equivalent B-site moieties. For example, layers $L_1$ and $L_2$ may include two structurally equivalent B-site metals, B and B', which have similar ionic radii and valences. Accordingly, the B' elements constitute a percentage of the total B-site elements in the average empirical formula for both layers $L_1$ and $L_2$. There will be a given formula portion a of each metal in the average empirical formula for each layer. Where $L_1$ and $L_2$ are identical, the layered superlattice material is of a non-mixed variety.

More generally, the ionic layers may repeat themselves in an overall superlattice according to the average repeating-structure formula $$G\{[(L_1\delta_1)(\Sigma_{1=1}{}^J\text{Mi}_{\alpha i})][(L_2\delta_2)(\Sigma_{1=1,J}\text{Mi}_{\alpha i})]\dots[(L_k\delta_k)(\Sigma 1=1{}^J\text{Mi}_{\alpha i})]\}G\dots, \tag{9}$$

wherein G is a superlattice-generator layer having a trivalent metal; L is a layer containing A-site and/or B-site materials with a different crystalline lattice as compared to other types of L layers denoted by the corresponding integer subscripts 1, 2, and k; $\delta$ is a mutually exclusive probability of finding a given L layer formed of a particular lattice structure; $\alpha$ is an empirical formula portion a given metal Mi in an average empirical formula for a corresponding L layer; and J is an integer equal to a total number of metals Mi in the corresponding L layer.

The overall average Formula (9) includes a plurality of different L layers, which are formed of ionic subunit cells. The A/B layer is a type of L layer that preferably has an A/B layer average empirical formula $$(A_{m-1}B_mO_a)^V, \tag{10}$$

wherein A is an A-site metal suitable for use in an A/B subunit cell; B is a B-site metal suitable for use in the A/B subunit cell; O is oxygen; m is a number having a value of at least one; c is a value selected from a group consisting of (3m+1), (3m+0.5) and (3m); S is a trivalent superlattice-generator element; and V is an A/B layer charge selected from a group consisting of 1+, 1−, 2−, and 3−. The A/B layer can have a perovskite-like octahedral structure; however, it can also include A-site metals and/or B-site metals arranged in a non-perovskite structure. That is, the above terms "A-site metal" and "B-site metal" refer to metal cations having suitable ionic radii for use in a perovskite lattice, but these cations do not necessarily occupy the A-site and B-site locations of a perovskite-like lattice. For example, (m=1) materials are not perovskite-like because they have no A-site element, however, (m=1) materials are still included in Formula (11).

Suitable A-site metals typically have an ionic radius ranging from about 0.9 Å to about 1.3 Å, and suitable B-site metals typically have an ionic radius ranging from about 00.5 Å to about 0.8 Å.

The perovskite-like AB layer is a type of L layer that preferably includes an empirical formula $$(A'_{n-1}B'_nO_{3n+1})^{V'}, \tag{11}$$

wherein A' is an A-site atom in a perovskite-like AB ionic subunit cell, B' is a B-site atom in the perovskite-like AB ionic subunit cell, O is oxygen, n is a number having a value greater than one, and V' is a second formula charge selected from a group consisting of 1+, 1−, 2−, and 3−, but is most preferably 2−. In Formula (11), at least one of A', B', and n are different from the corresponding elements A, B, and m of the A/B layer empirical Formula (10) for mixed layered superlattice materials. Most preferably, n is different from m.

The superlattice-generator layer preferably has an empirical formula of $$(S_2O_2)^{2+}, \tag{12}$$

wherein S is a trivalent superlattice-generator element such as bismuth or thallium.

The layer according to Formula (11) repeats itself as needed to balance the charges of layers according to Formulae (9) and (10). Typically, there will be one layer according to Formula (11) for each type of L layer according to Formula (9) and each L layer according to Formula (10).

A second electrode 16, also preferably formed of platinum having a thickness of from about 1000 Å to 2000 Å is formed atop layer 15, again by conventional atomic sputtering techniques.

In the integrated circuit art, the silicon crystal 11 is often referred to as a "substrate". Herein, the term "substrate" is more generally applied to any layer or combination of layers providing support for yet another layer. For example, the substrate 18 for the dielectric layer 15 is, immediately, the platinum first electrode 14, but also can be broadly interpreted to include the layers 11, 12, and 13 as well. We shall also refer to the device in various states of completion as a wafer 20 which is intended to include all of the layers completed up to the point of time in reference.

As is known in the art, the capacitor 10 may include other conventional layers, such as diffusion barrier layers. Many other materials may be used for any of the layers discussed above, such as silicon nitride for insulating layer 12, gallium arsenide, indium antimonide, magnesium oxide, strontium titanate, sapphire or quartz for substrate 11, and many other adhesion layer, barrier layer, and electrode materials. Further, it should be understood that FIG. 1 is not meant to be an actual cross-sectional view of any particular portion of an actual electronic device, but is merely an idealized representation which is employed to more clearly and fully depict the structure and process of the invention than would otherwise be possible. For example, the relative thicknesses of the individual layers are not depicted proportionately, since otherwise, some layers, such as the substrate 11 would be so thick as to make the drawing unwieldy.

Capacitor 10 preferably forms a portion of an integrated circuit memory 19, which, as known in the art, includes other electronic devices, such as transistors, other capacitors etc. These other devices are not depicted. For example, in a DRAM, the memory 19 would in include a memory array comprising rows and columns of memory cells, each memory cell including a transistor operably coupled with a capacitor 10. In addition, the dielectric layer 15 fabricated by the process of the invention may be incorporated into other devices, such as ferroelectric FETs, as well as capacitors.

Figure 2:
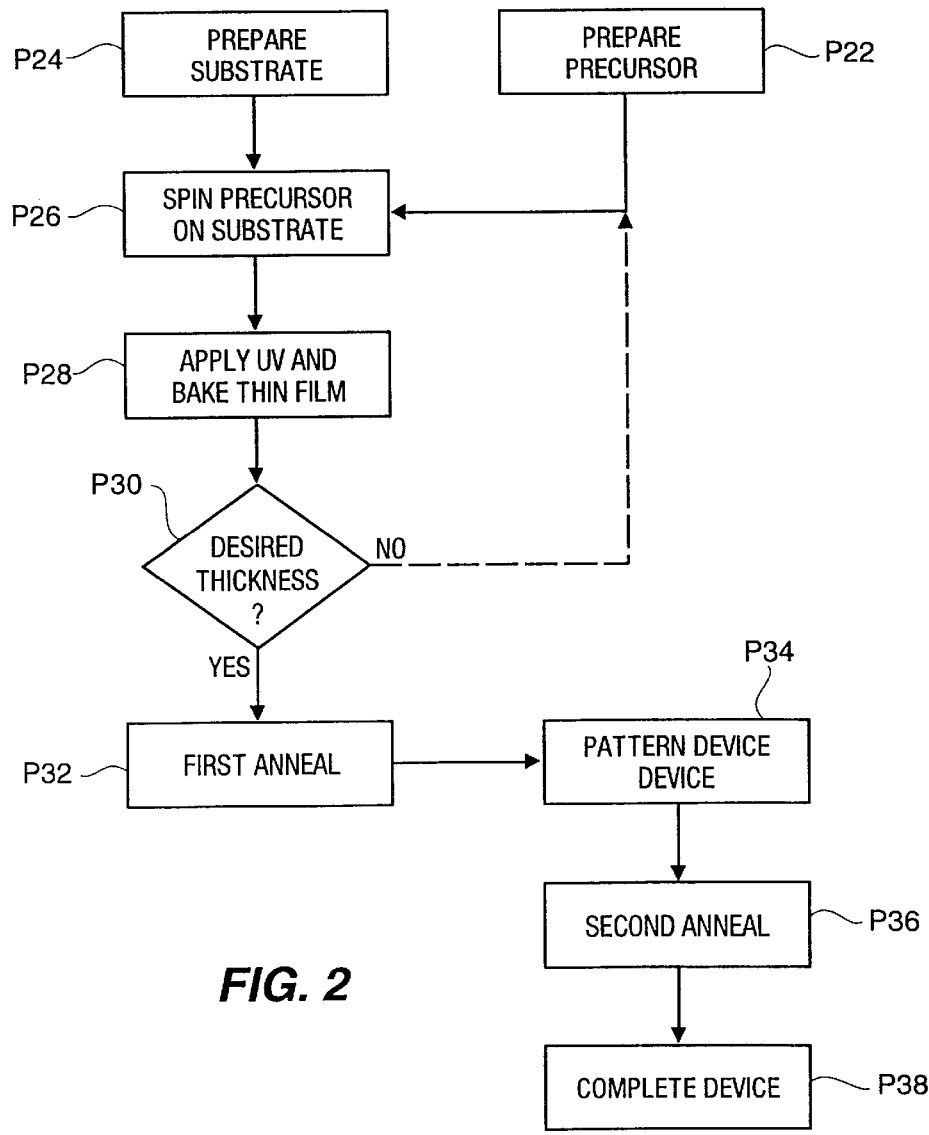
FIG. 2 depicts a flow chart of a process for fabricating the metal oxide metal- oxide capacitor of FIG. 1.

FIG. 2 depicts a flow chart for a process of fabricating a capacitor 10. For the sake of an orienting discussion, we shall consider the process of FIG. 2 without the use of UV radiation in step P28. The process of FIG. 2 without the use of UV in step P28, shall herein be termed the "standard process" because it is the process used to fabricate a "standard" metal oxide capacitor 10 to form a basis of comparison with capacitors 10 fabricated according to the present invention. Both the standard process and the UV process according to the invention are discussed in terms of the embodiment of FIG. 1, but could just as well be discussed in terms of any integrated circuit component having a ferroelectric or dielectric capacitor component.

A substrate 18 is provided and prepared in step P22. This substrate preferably includes silicon crystal 11 on which silicon dioxide layer 12 is grown by conventional methods, e.g., heating crystal 11 under an oxygen atmosphere in a diffusion furnace to a temperature of about 11000° C. An adhesion layer 13 (FIG. 1) is optionally sputtered onto layer 12, followed by sputtering of a first platinum electrode 14.

In step P24, a stock metal oxide precursor solution is prepared. This step may be performed just prior to the deposition of metal oxide dielectric 15, but is generally done well in advance. The solution preparation step is preferably conducted under an inert argon or nitrogen atmosphere, or at least a dry air atmosphere. The preferred reaction includes reacting a metal alkoxycarboxylate with a metal alkoxide or a metal carboxylate to provide a reaction product having a central —O—M—O—M—O— structure, e.g.:

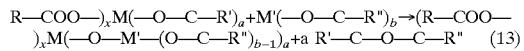

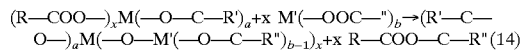

where M and M' are metals; R and R' are defined above; R" is an alkyl group preferably having from about zero to sixteen carbons; and a, b, and x are integers denoting relative quantities of corresponding substituents that satisfy the respective valence states of M and M'. Generally the reaction of Equation (13) will predominate. Thus, ethers having low boiling points are generally formed. These ethers boil out of the pre-precursor to leave a final product having a reduced organic content and the metal-oxygen-metal bonds of the final desired metal oxide already partially formed. If the heating is sufficient, some of the reaction (14) will also occur, creating metal-oxygen-metal bonds and esters. Esters generally have higher boiling points and remain in solution. These high boiling point organics slow down the drying process after the final precursor is applied to a substrate, which tends to reduce cracking and defects; thus, in either case, metal-oxygen-metal bonds are formed and the final precursor performance is improved.

If a metal-carboxylate is added to the metal-alkoxycarboxylate and the mixture is heated, the following reaction occurs:

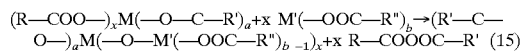

where R—COOOC—R' is an acid anhydride, and the terms are as defined above. This reaction requires considerably more heat than do the reactions (13) and (14) above, and proceeds at a much slower rate. The reaction products of equations (13)–(15) can be heated with excess carboxylic acid to substitute carboxylate ligands for alkoxide ligands, thereby reducing the hydrolyzing ability of the carboxylated products and increasing the precursor shelf life. The solution molarity is preferably adjusted to a value ranging from 0.1 to 0.5 moles of a $Bi_2$ normalized empirical metal oxide formula based on the amount of metals in the precursor prior to application on a substrate.

In step P26, the precursor solution is applied to substrate 18, preferably while spinning the wafer at 1300 RPM to 2000 RPM from about 20 seconds to about 60 seconds. Spin-coating normally consumes about 3 ml of precursor solution, and is most preferably conducted at 1500 rpm. Alternatively, step P26 may include the use of a misted deposition process, such as the technique described in copending application Ser. No. 07/993,380, which is hereby incorporated by reference herein to the same extent as though fully disclosed herein.

Step P28 includes baking the precursor, preferably in air or dry nitrogen, and preferably at a temperature of from about 120° C. to 500° C. for a period of time sufficient to remove substantially all of the organic materials from the liquid thin film and produce a solid metal oxide thin film 15. Some minor carbon residue may be expected in the final metal oxide product due to the calcining of organic substituents that remain after the baking process. By way of example, step P28 can be performed at 400° C. for at least 2 minutes in air.

Step P28 can be subdivided into sequential heating steps each having a higher temperature than its predecessor. This stepped baking procedure reduces thermal shock to the precursor that could result in bubbling or cracking of the precursor film. A stepped baking procedure preferably includes a sequence of steps as follows: (1) baking the substrate for one to five minutes in air on a hot plate having a temperature ranging from 120° C. to 160° C.; (2) baking the substrate for two to six minutes in air on a hot plate having a temperature ranging from 240° C. to 280° C., and (3) exposing the substrate to an electromagnetic radiation source (not UV) that is capable of raising a surface temperature of the substrate to at least about 700° C. for a preferred maximum time of about forty seconds. Item (3) above can be conducted, for example, by using a tungsten-halogen lamp (visible spectrum) to achieve a 725° C. temperature over thirty seconds including a 100° C./second ramp from room temperature to 725° C. In step P30, if the resultant dried film is not of the desired thickness, then steps P26 and P28 are repeated until the desired thickness is obtained.

Step P32 includes annealing the dried precursor to form a crystalline metal oxide layer 15. The first anneal is preferably performed in oxygen at a temperature of from 500° C. to 1000° C. for a time ranging from 30 minutes to 2 hours. Step P32 is preferably conducted at from 700° C. to 850° C. for 30 to 90 minutes in an oxygen atmosphere in a push/pull process including 5 minutes for the "push" into a diffusion furnace and 5 minutes for the "pull" out of the furnace. The most preferred anneal temperature is 800° C. for 80 minutes.

In step P34, the device is patterned by conventional methods. Second electrode 16 is sputtered into place. The device is patterned through the application of a negative or positive resist followed by ion etching and removal of the resist.

Step P36 includes annealing the patterned device to remove patterning defects. It is preferred that this second anneal reach a maximum temperature within fifty degrees of the maximum temperature of the first anneal, in order to reduce interlayer thermal stresses. For example, the second anneal is preferably conducted at 800° C. for thirty minutes after the first anneal occurred at 800° C. Step P38 includes completing the device by adding additional layers and further annealing, as needed.

The application of UV radiation has been omitted from the discussion above. Ultraviolet light is most preferably applied as part of step P28, but may also be applied with less effect as part of steps P24 and P32.

The UV spectrum has wavelengths that range from about 4 to 400 nanometers ("nm"). A particularly preferred band of UV radiation for use in the invention has a wavelength ranging from about 180 to about 300 nm and most preferably ranges from about 220 to about 260 nm. These wavelengths are selected to target the C—O bonds in the precursor for dissociation. The UV radiation is preferably applied in step P28 through a tunable eximer laser; however, other acceptable UV sources exist, such as a Danielson UV light source or a deuterium ($D_2O$) lamp.

The UV exposure technique of step P28 preferably includes an exposure intensity ranging from five to twenty mW/cm$^2$ over a period of time ranging up to about ten minutes. Ultraviolet wavelengths in the most preferred range are intended to dissociate carbon to oxygen sigma bonds in the precursor solution. The dissociated organic ligands and other substituents can then be removed from the substrate as vapor. This UV-induced dissociation provides a metal oxide having a reduced carbon content, as compared to "standard" metal oxides that formed in the absence of concentrated UV radiation.

The UV radiation also influences the formation of crystal grains in metal oxide materials produced according to this process, as confirmed through c-axis orientation differences in X-ray diffraction peak intensity values. This UV-influenced crystal formation is also characterized by significant changes in the electronic properties of the metal oxides, namely, polarization fatigue and leakage current improvements.

The following non-limiting examples set forth preferred materials and methods for practicing the present invention. Examples 1–7 serve to describe a preferred method for providing the stock precursor solutions that may be used in step P24

EXAMPLE 1

Preparation of a Strontium Bismuth Tantalate Liquid Precursor Resolution

The precursor ingredients of Table 1 were obtained from the indicated commercial sources and subdivided to obtain the portions shown. In the tables below, "FW" indicates formula weight, "g" indicates grams, "mmoles" indicates millimoles, and "Equiv." indicates the equivalent number of moles in solution.

TABLE 1

| Ingredient | Formula Weight (g/mol) | Grams | mmole | Molar Equiv. | Vendor |
|---|---|---|---|---|---|
| tantalum pentabutoxide $Ta(OC_4H_9)_5$ | 546.52 | 43.722 | 80.001 | 2.0000 | Vnipim |
| 2-ethylhexanoic acid | 144.21 | 72.684 | 504.01 | 12.600 | Aldrich |
| strontium | 87.62 | 3.5048 | 40.000 | 1.0000 | Strem |
| bismuth tri-2-ethylh-exanoate (in naphtha) $Bi(O_2C_6H_{11})_5$ | (765.50) | 64.302 | 84.000 | 2.1000 | Strem |

The tantalum pentabutoxide and 2-ethylhexanoic acid were placed in a 250 ml Erlenmeyer flask with 40 ml of xylenes, i.e., about 50 ml xylenes for each 100 mmol of tantalum. The flask was covered with a 50 ml beaker to assist in refluxing and to isolate the contents from atmospheric water. The mixture was refluxed with magnetic stirring on a 160° C. hot plate for 48 hours to form a substantially homogenous solution including butanol and tantalum 2-ethylhexanoate. It should be understood that the butoxide moiety in solution was almost completely substituted by the 2-ethylhexanoic acid, but full substitution did not occur within the heating parameters of this example. At the expiration of 48 hours, the 50 ml beaker was removed and the hot plate temperature was then raised to 200° C. for distillation of the butanol, water, and ether fractions, in order to eliminate the same from solution. The flask was removed from the hot plate when the solution first reached a temperature of 124° C., which indicated that substantially all butanol, ether, and water had exited the solution. The flask and its contents were cooled to room temperature.

The strontium and 50 ml of 2-methoxyethanol solvent were added to the cooled mixture in the flask, as well as a 100 ml portion of xylenes solvent. The flask and its contents were returned to the hot plate at 200° C. and refluxed for five hours with the 50 ml beaker again in place for reaction to form a tantalum-strontium alkoxycarboxylate complex according to equations (13) and (14). The beaker was removed and the solution temperature was allowed to rise to 125° C. for elimination of the 2-methoxyethanol solvent from solution, as well as any ethers, alcohols, or water in solution. After removal from the heat source, the flask was permitted to cool to room temperature. The bismuth tri-2-ethylhexanoate was added to the cooled solution, which was further diluted to 200 ml with xylenes to form a pre-precursor solution that was capable of forming 0.200 moles of $SrBi_{2.1}Ta_2O_{9.15}$ per liter in the absence of bismuth volatilization.

The precursor formulation was designed to compensate for anticipated bismuth volatilization during a process of manufacturing solid metal oxides from the liquid precursor. Specifically, the $Bi_{2.10}$ moiety included an approximate five percent excess (0.10) bismuth portion with respect to Formula (5). After accounting for the anticipated bismuth volatilization during the forthcoming annealing steps, the pre-precursor solution would be expected to yield a stoichiometric n=2 material according to Formula (3), i.e., 0.2 moles of $SrBi_2Ta_2O$, per liter of solution.

EXAMPLE 2

Preparation of a Pre-precursor Solution Containing Tantalum 2-Ethylhexanoate in Xylenes The ingredients of Table 2 were purchased from commercial sources and subdivided to obtain the portions shown.

TABLE 2

| Ingredient | Formula Weight (g/mol) | Grams | mmole | Vendor |
|---|---|---|---|---|
| tantalum pentabutoxide $Ta(OC_4H_9)_5$ | 546.52 | 22.886 | 48.040 | Vnipim |
| 2-ethylhexanoic acid | 144.21 | 36.373 | 252.22 | Aldrich |

The tantalum pentabutoxide and 2-ethylhexanoic acid were placed in a 250 ml Erlenmeyer flask with 30 ml of xylenes. The flask was covered with a 50 ml beaker to assist in refluxing and to isolate the contents from atmospheric water. The mixture was refluxed with stirring on a 160° C. hot plate for 48 hours to form a substantially homogenous solution including butanol and tantalum 2-ethylhexanoate. The butoxide moiety in solution was almost completely substituted by the 2-ethylhexanoic acid, but full substitution did not occur within the heating parameters of this example. At the expiration of 48 hours, the 50 ml beaker was removed and the hot plate temperature was then raised to 200° C. for distillation to eliminate the butanol from solution. Accordingly, the flask was removed from the hot plate when the solution first reached a temperature of 124° C. The flask and its contents were cooled to room temperature. Xylenes were added to the hot solution to dilute the same to a normality of 0.4 mmol tantalum per gram of solution, and the solution was removed from the heat for cooling to room temperature.

EXAMPLE 3

Preparation of a Pre-precursor Solution Containing Bismuth 2-Ethylhexanoate in Xylenes and Naphtha The ingredients of Table 3 were purchased from commercial sources and subdivided to obtain the portions shown.

TABLE 3

| Ingredient | Formula Weight (g/mol) | Grams | mmole | Vendor |
|---|---|---|---|---|
| bismuth tri-2-ethylhexanoate (in naphtha) $Bi(O_2C_6H_{11})_5$ | (765.50) | 66.752 | 87.201 | Strem |

The bismuth tri-2-ethylhexanoate in naphtha was poured into a 250 ml Erlenmeyer flask and mixed with xylenes to a normality of 0.4 mmoles of bismuth per gram of solution. The mixture was swirled in the flask to substantial homogeneity. No supplemental heating was provided due to the potential for disrupting bonds between the bismuth atoms and their corresponding carboxylate ligands.

EXAMPLE 4

Preparation of a Pre-precursor Solution Containing Niobium 2-Ethylhexanoate in Xylenes

TABLE 4

| Ingredient | Formula Weight (g/mol) | Grams | mmole | Vendor |
|---|---|---|---|---|
| niobium penta-2-ethylhexanoate (in xylenes) $Nb(O_2C_6H_{11})_5$ | (1,105.3) | 39.739 | 87.201 | Vnipim |

The niobium penta-2-ethylhexanoate in xylenes was poured into a 250 ml Erlenmeyer flask and mixed with additional xylenes to a normality of 0.4 mmoles per gram of solution. The mixture was swirled in the flask to substantial homogeneity without heating.

EXAMPLE 5

Preparation of a Strontium Bismuth Tantalate Liquid Precursor Solution Designed to Form Mixed Collated $L_1$ and $L_2$ Layered Superlattice Materials A strontium bismuth tantalate precursor solution including relative proportions of ingredients capable of forming 83% strontium tantalate $L_2$ and 17% tantalate $L_1$ metal oxide portions was prepared using the pre-precursor solutions of previous examples. A 2 ml aliquot of the 0.200M precursor solution from Example 1 was placed in a 250 ml Erlenmeyer flask, i.e., a sufficient volume of precursor to yield 0.4 mmoles of $SrBi_2Ta_2O_9$. A 0.210 g aliquot of the bismuth 2-ethylhexanoate solution from Example 3 (0.4 mmol $Bi^{3+}$/g) was also added to the flask, as was a 0.100 g aliquot of the tantalum 2-ethylhexanoate solution of Example 2 (0.4 mmol $Ta^{5+}$/g). The combined ingredients were swirled in the flask to a homogenous state. It should be noted that mixing of the combined precursor solutions from the various examples was facilitated by the use of a common xylenes solvent. The resultant mixture included a 5% excess bismuth moiety to account for bismuth volatilization during subsequent high-temperature annealing processes that would yield a solid metal oxide.

The relative proportions of ingredients in the precursor solution were designed, upon annealing of the dried precursor residue, to yield a solid mixed layered superlattice material having an empirical formula of $Sr_{0.833}Bi_2Ta_{1.833}O_{8.417}$. This material included a plurality of $L_1$, $L_2$, and G collated layers, namely, $(Bi_2O^2)^{2+}$ superlattice-generator layers according to Formula (12), 83% $(SrTa_2O_7)^{2-}$ $L_2$ layers according to Formula (11), and 17% $(TaO_{3.5})^{2-}$ $L_1$ layers according to Formula (10). These formulae did not account for the excess bismuth moiety in solution because the excess bismuth moiety compensates for bismuth volatilization losses during a 700° C. to 850° C. anneal. Of course, with the 5% excess bismuth, moiety in solution, the empirical formula would need to be adjusted in the event that no bismuth volatilization occurs during the formation of the solid metal oxide. The remaining excess bismuth could function as an A-site material in combination with the excess tantalum B-site atoms.

Additional mixed layered superlattice precursor solutions can be developed according to the following relationship:

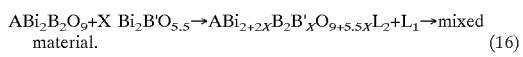
$$ABi_2B_2O_9 + X\ Bi_2B'O_{5.5} \rightarrow ABi_{2+2X}B_2B'_XO_{9+5.5X}L_2+L_1 \rightarrow \text{mixed material.} \quad (16)$$

The subscripts are normalized to a value of $Bi_2$ by multiplying each subscript by the quantity $\{2/(2+2x)\}$ for comparative purposes.

EXAMPLE 6

Strontium Bismuth Niobium Tantalate Liquid Precursor Solution for use in forming Mixed Crystal $L_1$ and $L_2$ Layered Superlattice Materials A strontium bismuth niobium tantalate precursor solution including relative proportions of ingredients capable of forming a 17:83 mixture of $L_1$ (m=1) and $L_2$ (n=2) metal oxide layer portions was prepared using the pre-precursor solutions of previous examples. A 2 ml aliquot of the 0.200M precursor solution from Example 1 was placed in a 250 ml Erlenmeyer flask. A 0.200 g aliquot of the bismuth 2-ethylhexanoate solution (0.4 mmol $Bi^{3+}$/g) from Example 3 was added to the flask, as was a 0.100 g aliquot of the niobium 2-ethylhexanoate solution (0.4 mmol $Nb^{5+}$/g) of Example 4. The combined ingredients were swirled in the flask to a homogenous state. Mixing of the combined precursor solutions from the various examples was facilitated by the use of a common xylenes solvent.

The relative proportions of ingredients in the precursor solution were designed, upon annealing of the dried precursor residue, to yield a mixed layered superlattice material having an empirical formula of $Sr_{0.833}Bi_2Nb_{0.167}Ta_{1.667}O_{8.417}$. This material included collated layers of mixed $L_1$ and $L_2$ materials according to Formula (9). The precursor design permitted equivalent substitution of the pentavalent B-site atoms $Ta^{5+}$ (ionic radius 0.68 Å) and $Nb^{5+}$ (ionic radius 0.69 Å) throughout the $L_1$ and $L_2$ materials. With respect to the stoichiometrically balanced 17:83 mixture of $L_1$ and $L_2$ strontium bismuth tantalum niobate materials, G is $(Bi_2O_2)^{2+}$ according to Formula (12). $L_1$ presents 17% of L layers having the empirical formulae $(Nb_{0.091}Ta_{0.909}O_{3.5})^{2-}$ according to Formula (10). $L_2$ includes a thickness of dual octahedra metal groups and has the empirical formula $SrNb_{0.182}Ta_{1.818}O_7)^{2-}$ according to Formula (11). $\delta_1$ is 0.17 based upon the amount of $L_1$ (niobium) materials added $\{0.2/(1+0.2)=0.17\}$. $\delta_2$ is 0.83 for the $L_2$ layers. For the $L_1$ layer portion, $M1_{\alpha1}$ is 0.091 based upon the amount of niobium added and $M2_{\alpha2}$ is 0.909 based upon the amount of tantalum added. For the $L_2$ layer portion, $M1_{\alpha1}$ is 1.0 for the strontium A-site metal, $M2\alpha2$ is 0.182 for the niobium B-site metal; and $M2_{\alpha1}$ is 1.818 for the tantalum B-site metal.

EXAMPLE 7

Preparation of a Strontium Titanlate Liquid Precursor Solution

A precursor solution for use in making an $ABO_3$ perovskite strontium titanate was prepared using the ingredients of Table 5, which were purchased from the commercial sources. The strontium was placed in the 2-ethylhexanoic acid together with 50 ml 2-methoxyethanol. The solution was stirred and heated to a maximum temperature of 115° C., in order to distill off all light hydrocarbon fractions and water and to produce a strontium-alkoxycarboxylate. The titanium isopropoxide was dissolved in 50 ml of methoxyethanol, stirred, and heated to a maximum of 115° C., in order to distill off the isopropanol and water. The strontium and titanium solutions were combined and stirred and heated to a maximum temperature of 125° C. to distill own to a volume of 60.0 ml.

TABLE 5

| REAGENTS FOR PRECURSOR FORMATION | | | | |
|---|---|---|---|---|
| Compound | FW | g | mmole | Equiv. |
| Strontium | 87.62 | 2.8023 | 31.982 | 1.0000 |
| 2-ethylhexanoic acid | 144.21 | 9.2283 | 63.992 | 2.0009 |
| Titanium Isopropoxide | 284.26 | 9.0912 | 31.982 | 1.0000 |

The concentration of the resultant precursor was 0.533 moles of $SrTiO_3$ per liter. Just prior to use, a xylene exchange was performed by adding 25 ml of xylene to 5 ml of the above $SrTiO_3$ solution and stirred and heated to a maximum temperature of 128° C. to distill out 7 ml to produce a final solution of 23 ml volume and a concentration of 0.116 moles of $SrTiO_3$ per liter.

EXAMPLE 8

Exemplary Layered Superlattice Materials

The methodology of Examples 1–6 may be followed to produce precursors that are capable of yielding the layered superlattice materials that are set forth in Table 6 below. Note that it is preferred for the precursors to contain 5% excess bismuth, but the excess bismuth amount is not reflected in Table 6. In Table 6, the term "X Value" refers to the variable X as used in Formula (16).

TABLE 6

PRECURSORS FOR FORMING
MIXED $L_1$ and $L_2$ LAYERED SUPERLATTICE MATERIALS
ACCORDING TO THE GENERALIZED FORMULA
$G\{[(L_1\delta_1)(\Sigma_{i=1}^J M i_{\alpha 1})][(L_2\delta_2)(\Sigma_{i=1}^J M i_{\alpha 1})] \ldots [(L_k\delta_k)(\Sigma_{i=1}^J M i_{\alpha 1})]\}G$,

| X Value | Empirical Formula** | $\delta_1$ | $\delta_2$ | $L_1$ Formula | $L_2$ Formula |
|---|---|---|---|---|---|
| 0 | $SrBi_2Ta_2O_9$ ($L_1$ additive below is $Bi_2TaO_{5.5}$) | 0 | 1.00 | (Not applicable; 100% n = 2 material) | $(SrTa_2O_7)^{2-}$ (100%) |
| 0.05 | $Sr_{0.952}Bi_2Ta_{1.952}O_{8.833}$ | 0.048 | 0.953 | $(TaO_{3.5})^{2-}$ | $(SrTa_2O_7)^{2-}$ |
| 0.10 | $Sr_{0.909}Bi_2Ta_{1.909}O_{8.682}$ | 0.091 | 0.909 | $(TaO_{3.5})^{2-}$ | $(SrTa_2O_7)^{2-}$ |
| 0.20 | $Sr_{0.833}Bi_2Ta_{1.833}O_{8.417}$ | 0.167 | 0.833 | $(TaO_{3.5})^{2-}$ | $(SrTa_2O_7)^{2-}$ |
| 0.25 | $Sr_{0.800}Bi_2Ta_{1.800}O_{8.300}$ | 0.200 | 0.800 | $(TaO_{3.5})^{2-}$ | $(SrTa_2O_7)^{2-}$ |
| 0.30 | $Sr_{0.769}Bi_2Ta_{1.769}O_{8.192}$ | 0.231 | 0.769 | $(TaO_{3.5})^{2-}$ | $(SrTa_2O_7)^{2-}$ |
| 0.40 | $Sr_{0.714}Bi_2Ta_{1.714}O_{8.000}$ | 0.286 | 0.714 | $(TaO_{3.5})^{2-}$ | $(SrTa_2O_7)^{2-}$ |
| 0.50 | $Sr_{0.667}Bi_2Ta_{1.667}O_{7.833}$ | 0.333 | 0.667 | $(TaO_{3.5})^{2-}$ | $(SrTa_2O_7)^{2-}$ |
| 0.60 | $Sr_{0.625}Bi_2Ta_{1.625}O_{7.688}$ | 0.375 | 0.625 | $(TaO_{3.5})^{2-}$ | $(SrTa_2O_7)^{2-}$ |
| 0.70 | $Sr_{0.588}Bi_2Ta_{1.588}O_{7.559}$ | 0.412 | 0.588 | $(TaO_{3.5})^{2-}$ | $(SrTa_2O_7)^{2-}$ |
| 0.80 | $Sr_{0.556}Bi_2Ta_{1.556}O_{7.444}$ | 0.444 | 0.556 | $(TaO_{3.5})^{2-}$ | $(SrTa_2O_7)^{2-}$ |
| 0.90 | $Sr_{0.526}Bi_2Ta_{1.526}O_{7.342}$ | 0.474 | 0.526 | $(TaO_{3.5})^{2-}$ | $(SrTa_2O_7)^{2-}$ |
| 1.00 | $Sr_{0.500}Bi_2Ta_{1.500}O_{7.250}$ | 0.500 | 0.500 | $(TaO_{3.5})^{2-}$ | $(SrTa_2O_7)^{2-}$ |
| | $Bi_2TaO_{5.5}$ | 1.00 | 0 | $(TaO_{3.5})^{2-}$ | (Not applicable; 100% m = 1 material) |
| 0 | $SrBi_2Ta_2O_9$ ($L_1$ additive below is $Bi_2TaO_{5.5}$) | 0 | 1.00 | (Not applicable; 100% n = 2 material) | $(SrTa_2O_7)^{2-}$ (100%) |
| 0.05 | $Sr_{0.952}Bi_2Nb_{0.048}Ta_{1.905}O_{8.833}$ | 0.048 | 0.952 | $(Nb_{0.024}Ta_{0.976}O_{3.5})^{2-}$ | $(SrNb_{0.049}Ta_{1.951}O_7)^{2-}$ |
| 0.10 | $Sr_{0.909}Bi_2Nb_{0.091}Ta_{1.818}O_{8.682}$ | 0.091 | 0.909 | $(Nb_{0.048}Ta_{0.952}O_{3.5})^{2-}$ | $(SrNb_{0.095}Ta_{1.905}O_7)^{2-}$ |
| 0.20 | $Sr_{0.833}Bi_2Nb_{0.167}Ta_{1.667}O_{8.416}$ | 0.167 | 0.833 | $(Nb_{0.091}Ta_{0.909}O_{3.5})^{2-}$ | $(SrNb_{0.182}Ta_{1.818}O_7)^{2-}$ |
| 0.25 | $Sr_{0.800}Bi_2Nb_{0.200}Ta_{1.600}O_{8.417}$ | 0.200 | 0.800 | $(Nb_{0.111}Ta_{0.889}O_{3.5})^{2-}$ | $(SrNb_{0.222}Ta_{1.778}O_7)^{2-}$ |
| 0.30 | $Sr_{0.769}Bi_2Nb_{0.231}Ta_{1.538}O_{8.192}$ | 0.231 | 0.769 | $(Nb_{0.130}Ta_{0.870}O_{3.5})^{2-}$ | $(SrNb_{0.261}Ta_{1.739}O_7)^{2-}$ |
| 0.40 | $Sr_{0.714}Bi_2Nb_{0.266}Ta_{1.429}O_{8.000}$ | 0.286 | 0.714 | $(Nb_{0.167}Ta_{0.833}O_{3.5})^{2-}$ | $(SrNb_{0.333}Ta_{1.667}O_7)^{2-}$ |
| 0.50 | $Sr_{0.667}Bi_2Nb_{0.333}Ta_{1.333}O_{7.833}$ | 0.333 | 0.667 | $(Nb_{0.200}Ta_{0.800}O_{3.5})^{2-}$ | $(SrNb_{0.400}Ta_{1.600}O_7)^{2-}$ |
| 0.60 | $Sr_{0.625}Bi_2Nb_{0.375}Ta_{1.25}O_{7.688}$ | 0.375 | 0.625 | $(Nb_{0.231}Ta_{0.769}O_{3.5})^{2-}$ | $(SrNb_{0.462}Ta_{1.538}O_7)^{2-}$ |
| 0.70 | $Sr_{0.588}Bi_2Nb_{0.411}Ta_{1.176}O_{7.559}$ | 0.412 | 0.588 | $(Nb_{0.259}Ta_{0.741}O_{3.5})^{2-}$ | $(SrNb_{0.519}Ta_{1.461}O_7)^{2-}$ |
| 0.80 | $Sr_{0.555}Bi_2Nb_{0.444}Ta_{1.111}O_{7.444}$ | 0.444 | 0.556 | $(Nb_{0.286}Ta_{0.714}O_{3.5})^{2-}$ | $(SrNb_{0.571}Ta_{1.429}O_7)^{2-}$ |
| 0.90 | $Sr_{0.526}Bi_2Nb_{0.473}Ta_{1.053}O_{7.342}$ | 0.474 | 0.526 | $(Nb_{0.310}Ta_{0.690}O_{3.5})^{2-}$ | $(SrNb_{0.621}Ta_{1.379}O_7)^{2-}$ |
| 1.00 | $Sr_{0.500}Bi_2Nb_{0.500}Ta_{1.500}O_{7.250}$ | 0.500 | 0.500 | $(Nb_{0.333}Ta_{0.667}O_{3.5})^{2-}$ | $(SrNb_{0.667}Ta_{1.333}O_7)^{2-}$ |
| | $Bi_2NbO_{5.5}$ | 1.00 | 0 | $(Nb_{0.35})^{2-}$ | (Not applicable; 100% m = 1 material) |
| 0 | $SrBi_2Nb_2O_9$ ($L_1$ additive below is $Bi_2TaO_{5.5}$) | 0 | 1.00 | (Not applicable; 100% n = 2 material) | $(SrNb_2O_7)^{2-}$ (100%) |
| 0.10 | $Sr_{0.909}Bi_2Nb_{1.818}Ta_{0.091}O_{8.682}$ | 0.091 | 0.909 | $(Nb_{0.942}Ta_{0.048}O_{3.5})^{2-}$ | $(SrNb_{1.905}Ta_{0.096}O_7)^{2-}$ |
| 0.20 | $Sr_{0.833}Bi_2Nb_{1.667}Ta_{0.167}O_{8.416}$ | 0.167 | 0.833 | $(Nb_{0.909}Ta_{0.091}O_{3.5})^{2-}$ | $(SrNb_{1.818}Ta_{0.182}O_7)^{2-}$ |
| 0.30 | $Sr_{0.769}Bi_2Nb_{1.538}Ta_{0.231}O_{8.192}$ | 0.231 | 0.769 | $(Nb_{0.870}Ta_{0.130}O_{3.5})^{2-}$ | $(SrNb_{1.739}Ta_{0.261}O_7)^{2-}$ |
| 0.40 | $Sr_{0.714}Bi_2Nb_{1.429}Ta_{0.286}O_{8.000}$ | 0.286 | 0.714 | $(Nb_{0.833}Ta_{0.167}O_{3.5})^{2-}$ | $(SrNb_{1.667}Ta_{0.333}O_7)^{2-}$ |
| 0.50 | $Sr_{0.667}Bi_2Nb_{1.333}Ta_{0.333}O_{7.833}$ | 0.333 | 0.667 | $(Nb_{0.800}Ta_{0.200}O_{3.5})^{2-}$ | $(SrNb_{1.600}Ta_{0.400}O_7)^{2-}$ |
| 1.00 | $Sr_{0.500}Bi_2Nb_{1.500}Ta_{0.500}O_{7.250}$ | 0.500 | 0.500 | $(Nb_{0.667}Ta_{0.333}O_{3.5})^{2-}$ | $(SrNb_{1.333}Ta_{0.667}O_7)^{2-}$ |

*G is $(Bi_2O_2)^{2+}$;
**These formulae do not acount for a 5% excess bismuth moiety in the corresponding precursor solution.

EXAMPLE 9

Production of a Standard Metal Oxide Sample without UV Processing

The fabrication method of FIG. 2 was conducted using the strontium bismuth tantalate of Example 1.

A conventional four inch diameter polycrystalline wafer was prepared to receive the $SrBi_2Ta_2O_9$ solution of Example 1. The preparation process included diffusion furnace baking at 1100° C. in oxygen according to conventional protocols for yielding a thick coating of silicon oxide 12 (see FIG. 1). The substrate including oxide 12 was cooled to room temperature, and inserted into a vacuum chamber for conventional DC magnetron sputtering. A discharge voltage of 95 volts and a current of 0.53 amperes was utilized at a sputter pressure of 0.0081 Torr to sputter a 160 Å thickness of titanium metal on oxide layer 12. A discharge voltage of 130 volts and a current of 0.53 amperes was then used to sputter a 2200 Å thickness of platinum atop the titanium metal.

The substrate (including titanium and platinum metals) was annealed in a diffusion furnace under a nitrogen atmosphere at 450° C. for two hours and ten minutes. This time included a five minute push into the furnace and a five minute pull out of the furnace. The resultant structure included layers 13 and 14 as depicted in FIG. 1.

In step P24, a 2 ml volume of the 0.2M $SrBi_2Ta_2O_9$ precursor from Example 1 was adjusted to a 0.13M concentration by the addition of 1.08 ml n-butyl acetate, and passed through a 0.2 μm filter. The substrate was spun at 1500 rpm in a conventional spin-coater machine. An eyedropper was used to apply precursor solution to the substrate for thirty seconds while spinning. The precursor-coated substrate was removed from the spin-coating machine and dried in air for two minutes on a 140° C. hot plate. The substrate was dried for an additional four minutes on a second hot plate at 260° C. The substrate was dried for an additional thirty seconds in oxygen at 725° C. using a HEATPULSE 410 tungsten-halogen lamp apparatus that was purchased form AG Associates Inc. as the heat source. The tungsten halogen bulbs included eight J208V bulbs (purchased from Ushio of Japan)

for a total of 1200 W. The lamp heating profile included a 100° C./second ramp up to 725° C. from room temperature. The spin-coating and drying procedure was repeated a second time to increase the overall thickness of layer 15. In this example, the substrate was not exposed to UV radiation in any one of the three successive baking steps.

The substrate including dried precursor material in the position of layer 15 was annealed under an oxygen ($O_2$) atmosphere for eighty minutes at 800° C. in a diffusion furnace. This time included a five minute push into the furnace and a five minute pull out of the furnace.

Platinum metal was sputtered to a 2200 Å thickness using a DC magnetron as before. The substrate was patterned using a conventional negative resist mask and argon ion etching. After removal of the resist, the device was annealed under oxygen at 800° C. for forty minutes including a five minute push into the diffusion furnace and a five minute pull out of the furnace. This process may be repeated with alternative precursors to form any of the metal oxide materials listed in Table 6.

EXAMPLE 10

Production of an Oriented Metal Oxide Sample with UV Processing

The manufacturing technique of Example 9 was repeated in an identical manner again using the precursor of Example 1, except step P28 further included exposing the substrate to UV radiation during the entire time that it was baking on the hot plate at 150° C. and again while it was baking at 270° C. The UV source that was utilized was a Danielson lamp that yielded a spectrum ranging from 180 nm to about 300 nm with an intensity of about 9 mW/cm$^2$ at 220 nm and 15 mW/cm$^2$ at 260 nm. The substrate was not exposed to UV radiation while it was being exposed to light from the tungsten-halogen lamp. This process may be repeated with alternative precursors to form any of the metal oxide materials listed in Table 6.

EXAMPLE 11

Comparative Leakage Current Measurements

Figure 3:
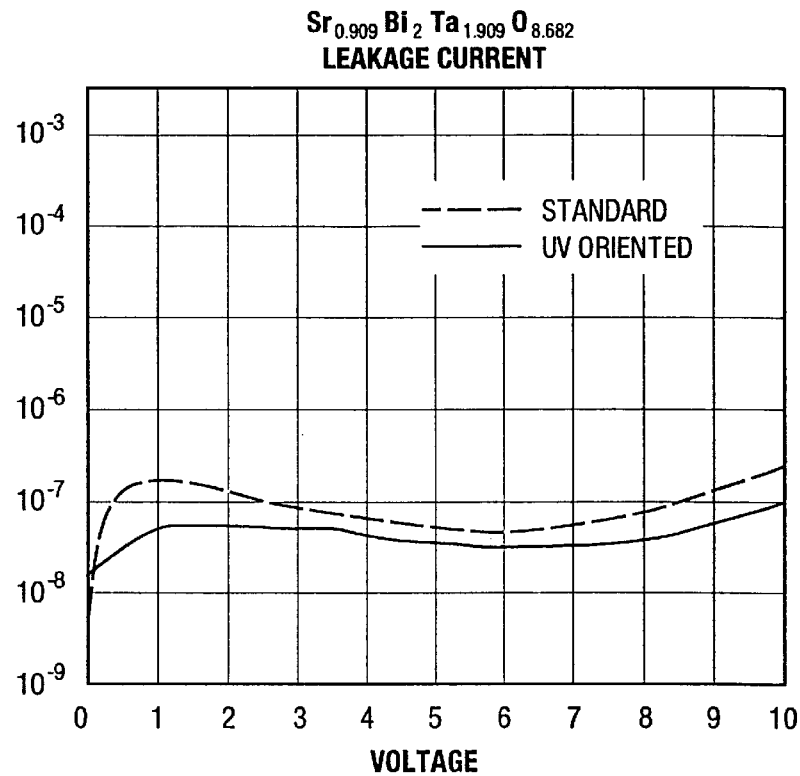
FIG. 3 depicts a graph of leakage current density versus voltage comparing a standard process strontium bismuth tantalate capacitor in which the thin film was baked on a hot plate without UV radiation against another strontium bismuth tantalate capacitor in which the thin film was UV baked.

A capacitor 10 that contained a standard process $Sr_{0.0909}Bi_2Ta_{1.909}O_{8.682}$ sample produced according to Example 9 was operably connected to a Hewlit Packard 4145A semiconductor analyzer (picoampmeter) for purposes of conducting leakage current measurements. A capacitor 10 that included a UV oriented $Sr_{0.909}Bi_2Ta_{1.909}O_{8.682}$ sample produced according to Example 10 was subjected to identical measurements. FIG. 3 depicts a plot of the data obtained, and includes a plot of leakage current in amperes per cm$^2$ (logarithmic scale) versus voltage on the ordinate. The data points were obtained in 0.05V increments in a range between 0 and 10V. The magnitude of the leakage current density for both samples varied between $10^{-7}$ and $10^{-8}$ over the interval between 1V and 8V. The relatively straight interval lines indicate that a single charge transfer mechanism predominated over the 2–8V interval. The standard sample (indicated by the dashed line) consistently remained about one-half of an order of magnitude greater than that of the UV oriented sample. Accordingly, it is seen that UV treatment in the drying process provides a lower (and better) leakage current density in strontium bismuth tantalate materials.

Figure 4:
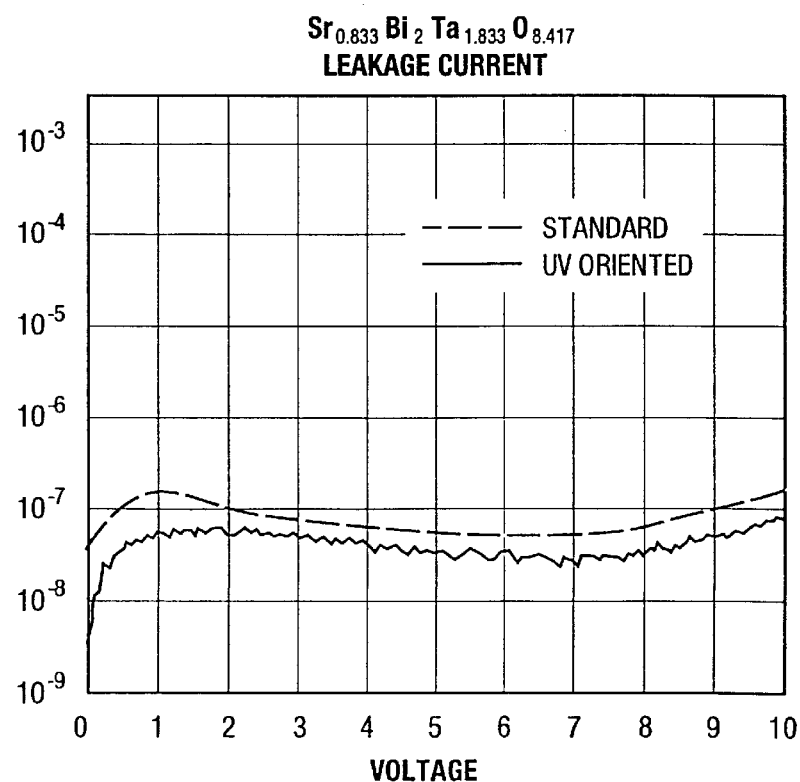
FIG. 4 depicts a graph like that of FIG. 4, but includes comparative leakage current density data for a strontium bismuth tantalate samples having a different stoichiometric composition from the subject material of FIG. 3.

A standard process $Sr_{0.833}Bi_2Ta_{1.833}O_{8.417}$ sample that was prepared according to Example 9 was subjected to leakage current measurements, as was a UV oriented $Sr_{0.833}Bi_2Ta_{1.833}O_{8.417}$ sample of Example 10. FIG. 4 depicts the results as a plot of leakage current density in log (amps/cm$^2$) versus applied voltage. Again, the UV oriented sample had a lower leakage current, which ranged from about 0.5 to 0.25 of an order of magnitude less than the standard sample over the voltage interval between one and ten volts.

Figure 5:
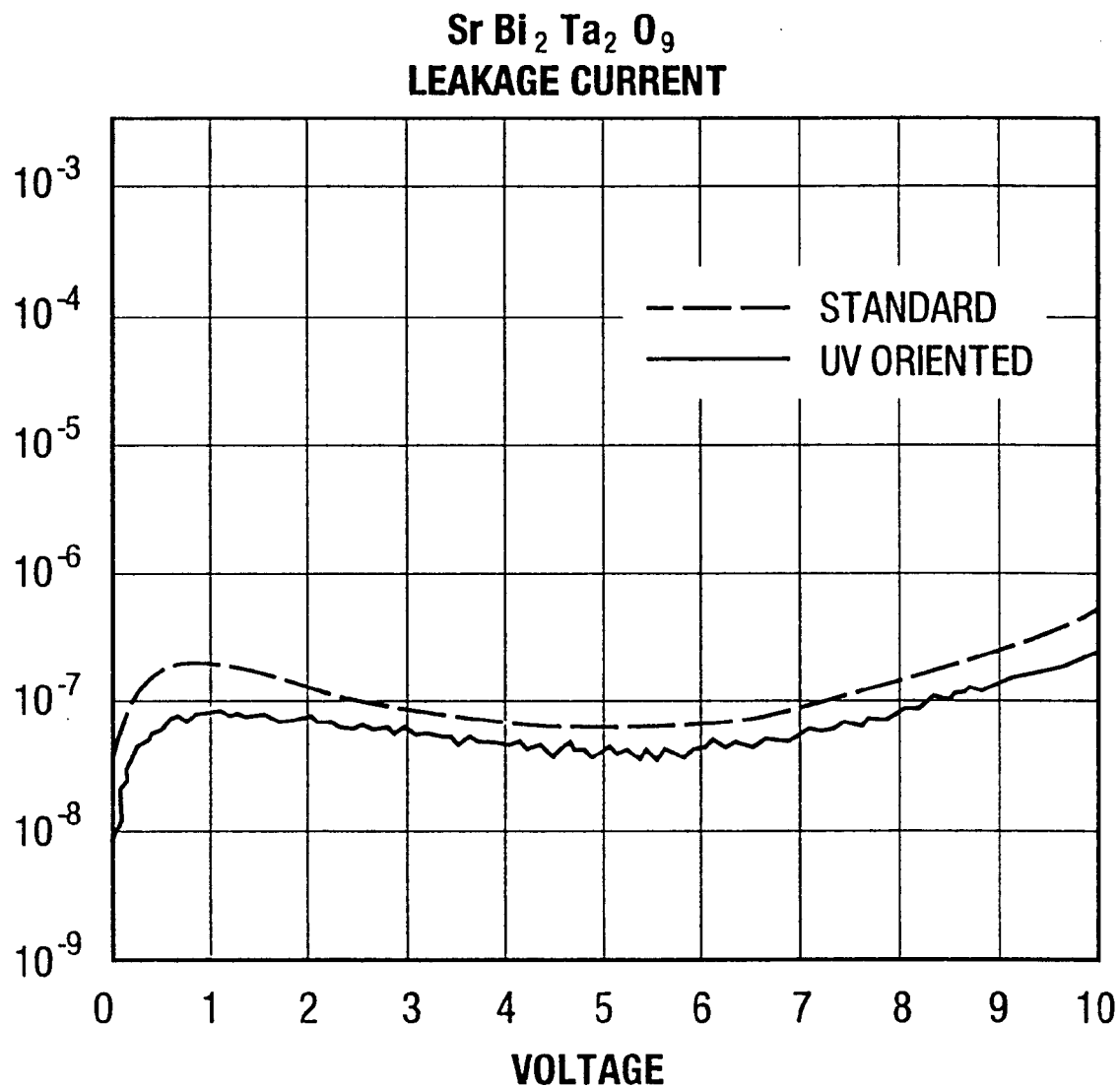
FIG. 5 depicts a graph like that of FIGS. 3 and 4, but includes comparative data obtained from strontium bismuth tantalate samples of yet another stoichiometry.

A standard process $SrBi_2Ta_2O_9$ sample prepared according to Example 9 was subjected to leakage current measurements in comparison against those from a UV oriented sample. FIG. 5 depicts the results. Again, the UV oriented sample had a leakage current density of about 0.2 to 0.5 of an order of magnitude less than the standard process sample.

EXAMPLE 12

Comparative Polarization Measurements

Figure 6:
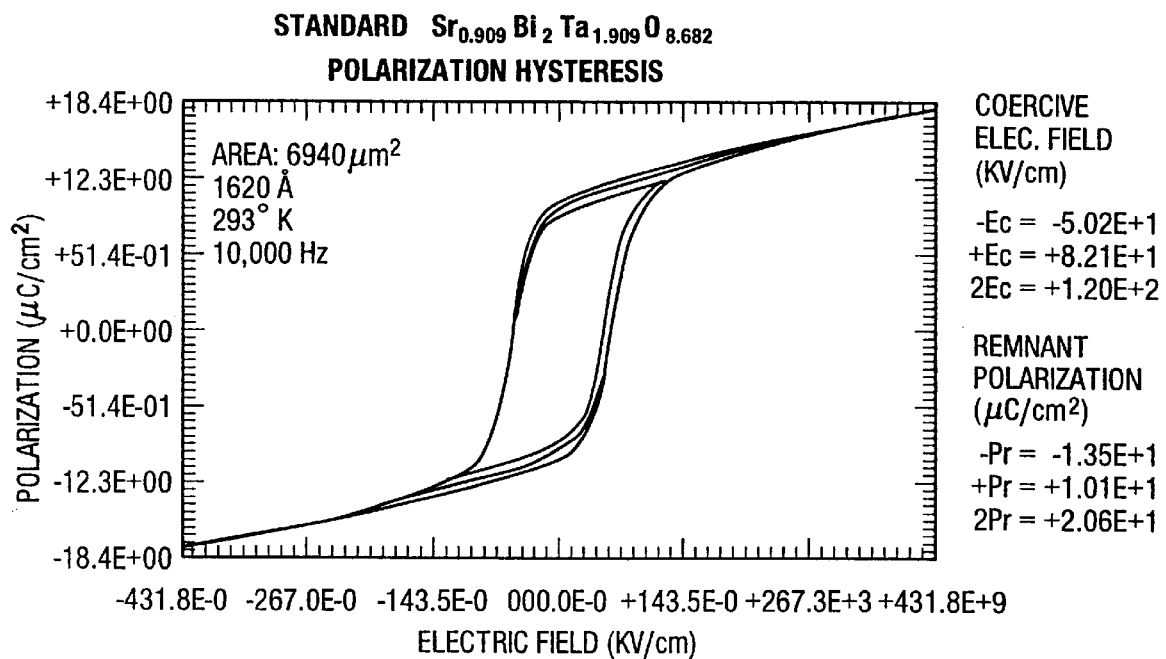
FIG. 6 depicts polarization hysteresis curves for a standard process strontium bismuth tantalate material as polarization versus applied electric field.

A capacitor 10 that included a 1600 Å thickness of standard process $Sr_{0.909}Bi_2Ta_{1.909}O_{8.682}$ material was subjected to polarization hysteresis measurements on an uncompensated Sawyer-Tower circuit including a Hewlit Packard 3314A function generator and a Hewlit Packard 54502A digitizing oscilloscope. Measurements were obtained from the film at 20° C. using a sine wave function having a frequency of 10,000 Hz and voltage amplitudes of 0.25, 0.5, 1.0, 1.5, 2.0, 2.5, 3.0, 4.0, 5.0, and 7.0V. FIG. 6 depicts a plot of the data obtained as a polarization hysteresis curve for each of the voltage amplitudes. The X-axis is an electric field in KV/cm, and the Y-axis is an observed remanent polarization in $\mu C/cm^2$. The steeply rising, quasi-rectangular, boxy nature of the hysteresis curve indicates an excellent ferroelectric memory-switching performance with a remanent polarization (2Pr) value up to about 21 $\mu C/cm^2$ at voltages greater than about 5V.

Figure 7:
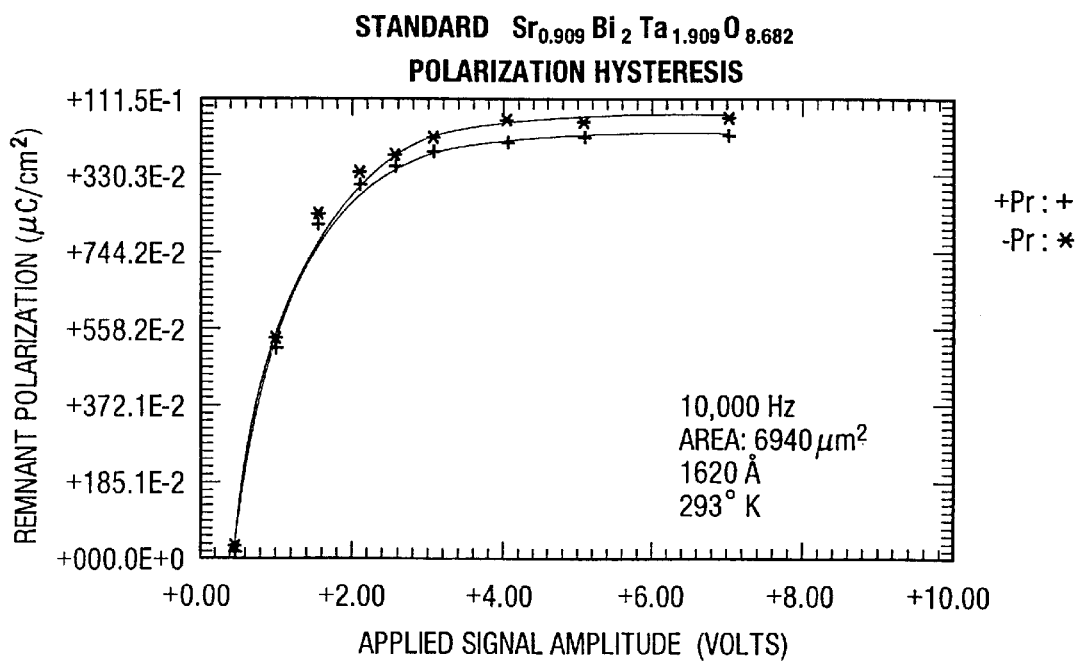
FIG. 7 depicts a graph of remanent polarization values versus applied voltage for the standard process strontium bismuth tantalate material of FIG. 6.
Figure 8:
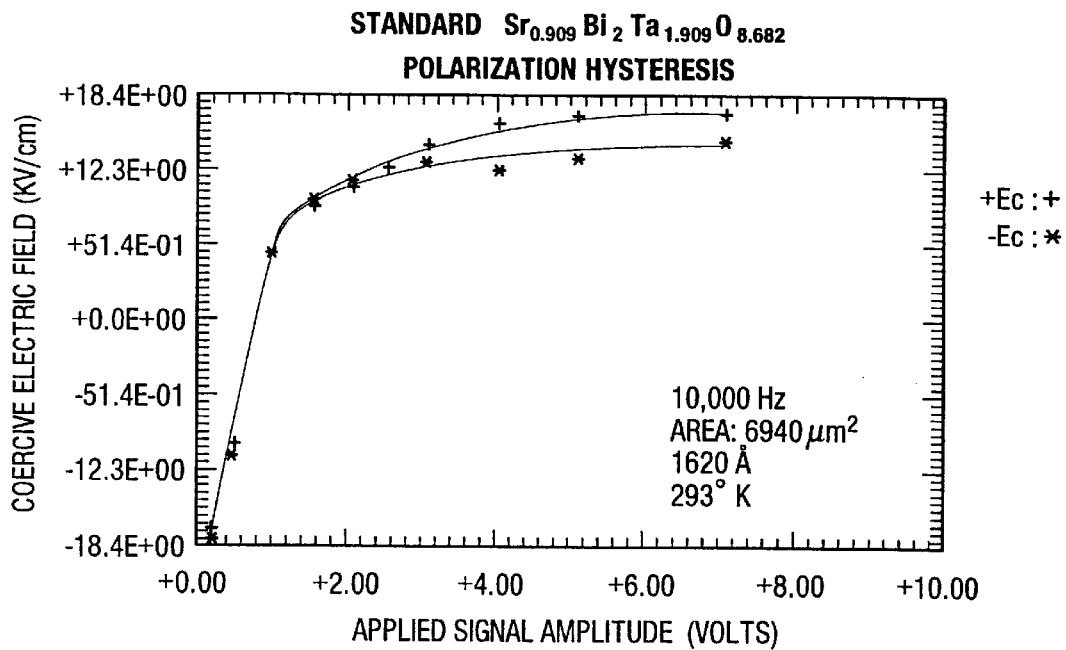
FIG. 8 depicts a graph of coercive electric field versus allied voltage for the standard process strontium bismuth tantalate material of FIG. 6.

FIG. 7 is a plot of remanent polarization versus applied voltage for each of the hysteresis loops in FIG. 6, and indicates that the standard process $Sr_{0.909}Bi_2Ta_{1.909}O_{8.682}$ sample was fully switched at applied voltages greater than about 2V. FIG. 8 is a plot of coercive electric field versus applied voltage for each of the polarization loops of FIG. 6, and indicates that a coercive electric field of about 54.4 KV/cm was required to switch the standard process sample.

Figure 9:
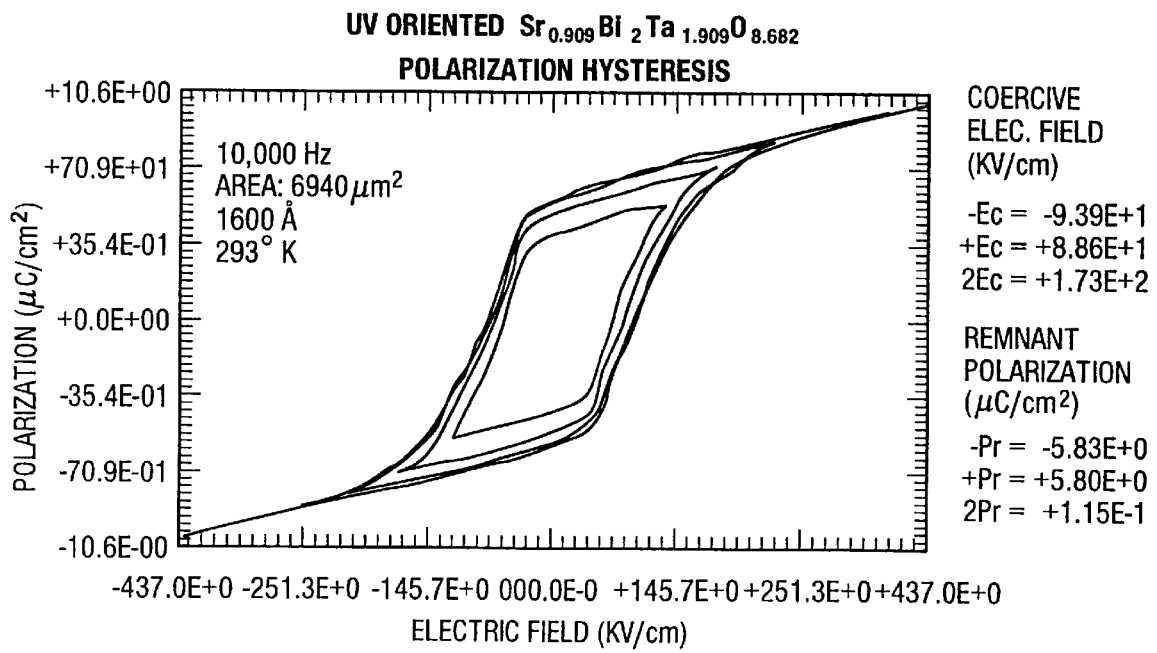
FIG. 9 depicts a polarization hysteresis curve like that of FIG. 6, but includes data obtained from a UV oriented strontium bismuth tantalate material having a the same stoichiometry as that of the FIG. 6 sample.
Figure 10:
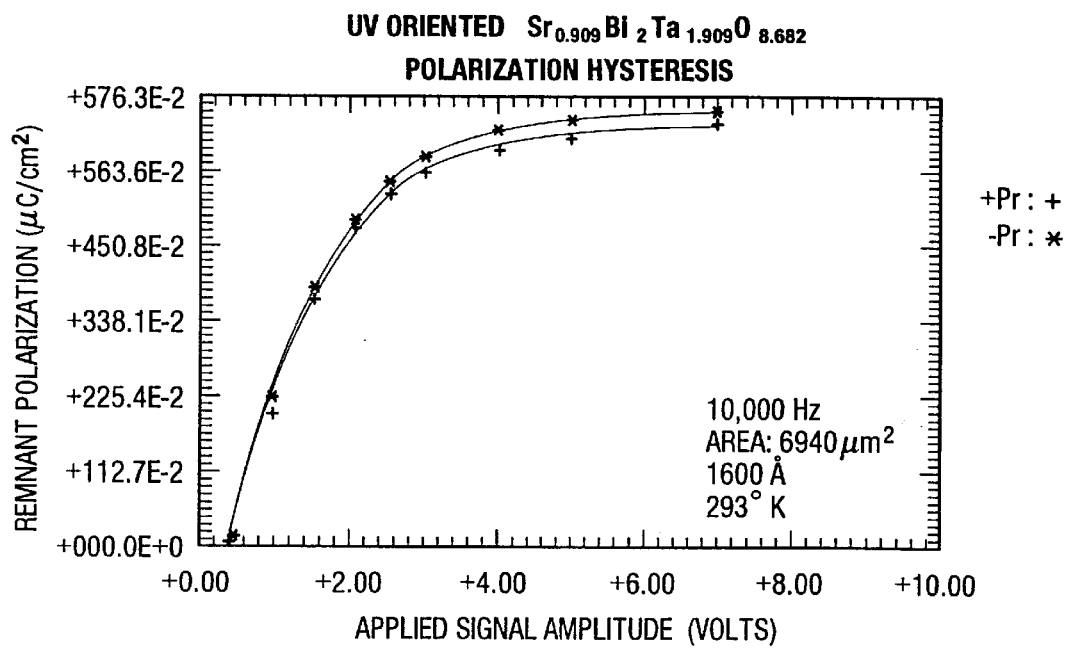
FIG. 10 depicts a graph of remanent polarization values versus applied voltage for the UV oriented strontium bismuth tantalate material of FIG. 9.
Figure 11:
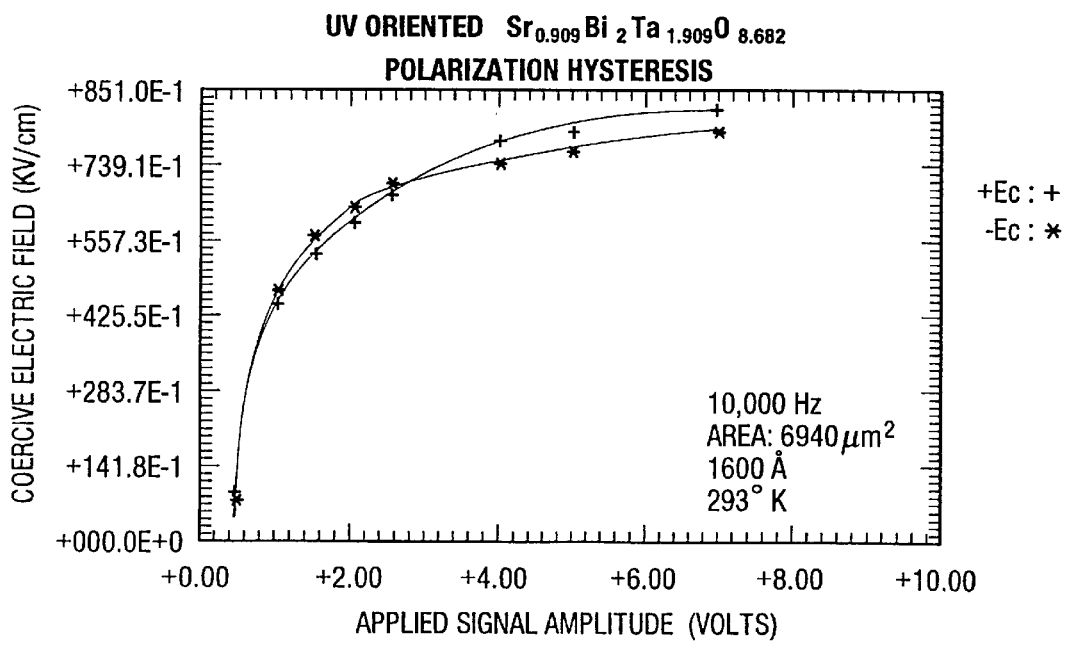
FIG. 11 depicts a graph of coercive electric field versus allied voltage for the UV oriented strontium bismuth tantalate material of FIG. 9.

A UV oriented $Sr_{0.909}Bi_2Ta_{1.9093}O_{8.682}$ sample was subjected to identical hysteresis measurements for comparative purposes. FIG. 9 is a polarization hysteresis plot like that of FIG. 6, and indicates that 2Pr polarization dropped to 11.5 $\mu C/cm^2$ at voltages exceeding about 5V for the UV oriented sample. FIG. 10 is a plot of remanent polarization versus applied voltage for each of the hysteresis loops in FIG. 9, and indicates that the standard process $Sr_{0.909}Bi_2Ta_{1.909}O_{8.682}$ sample was fully switched at applied voltages greater than about 2V. FIG. 11 is a plot of coercive electric field versus applied voltage for each of the polarization loops of FIG. 9, and indicates that a coercive electric field of about 70 KV/cm was required to switch the standard process sample.

Figure 23:
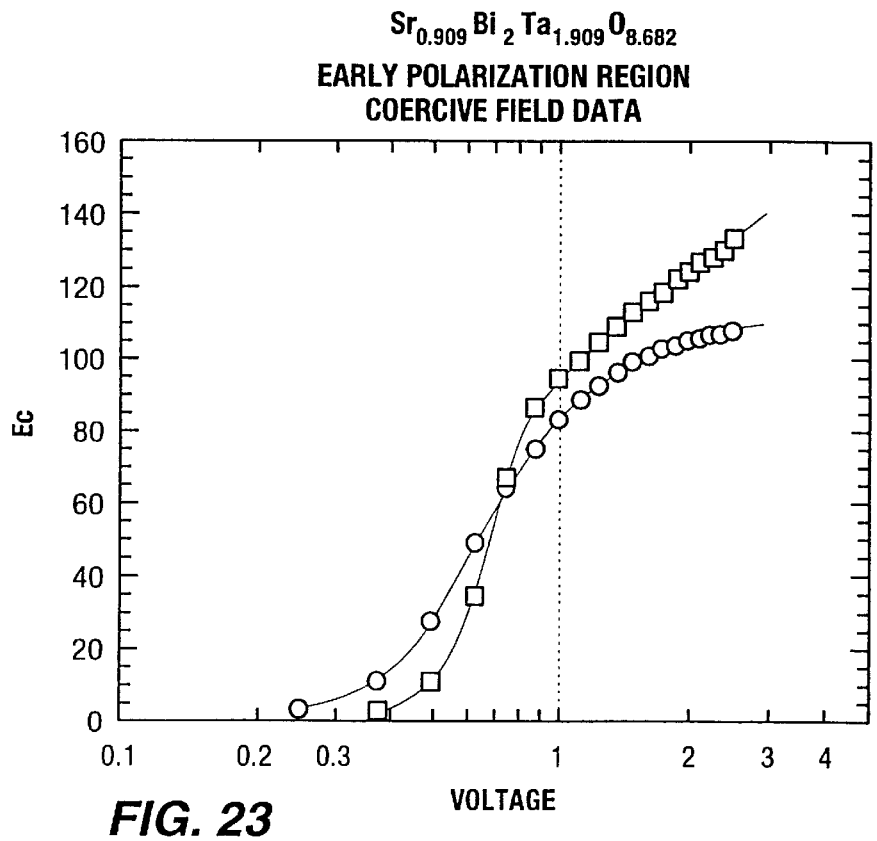
FIG. 23 depicts a coercive electric field curve for the early region of two strontium bismuth tantalate samples that had identical stoichiometries, but were processed under different UV lighting conditions.

Polarization measurements on the standard process and UV oriented samples of the $Sr_{0.909}Bi_2Ta_{1.909}O_{8.682}$ materials were repeated using a smaller voltage increment step of 0.13V. FIG. 23 depicts the results for both samples, and serves to compare the early region of the polarization curves. The UV oriented sample has a steeper rise in the early applied voltage range from 0.3 to 1.0V. The steeper rise in this region of the curve is a performance improvement relative to the standard process sample because the more gradual rise of the standard process material makes this material more susceptible to noise-induced partial polarization switching. The UV oriented sample is more restant to the effects of electric noise.

EXAMPLE 13

Pund Switching Measurements

A standard process $Sr_{0.833}Bi_2Ta_{1.833}O_{8.417}$ sample was connected to a Hewlit Packard 8115A dual channel pulse generator, a Hewlit Packard 54502A digitizing oscilloscope, and 50 ohm load resistor for purposes of conducting PUND switching measurements. The PUND switching curves are given in terms of nanoseconds versus an ordinate of current in amps. The PUND curves are generated in a well-known manner by first initializing the sample with a pulse in the negative direction, then measuring the current through the resistive load for a series of four voltage pulses that give the measurement its name: a positive (P) pulse, a second positive of up (U) pulse, a negative (N) pulse, and then another negative or down (D) pulse. All pulses have the same absolute amplitude. The initial negative pulse makes sure the material starts with a negative polarization. The first positive, "P", pulse therefore switches the material to a positive polarization. Since the sample is already polarized positively, the second, or "U", pulse measures the change between the residual polarization and the saturated polarization in the positive direction. Likewise the "N" pulse measures the negative switching current, and the "D" pulse measures the change between the residual polarization and the saturated polarization in the negative direction.

For a standard architecture of a memory cell (but not for all architectures) the PUND curves indicate the suitability of the material for a non-volatile ferroelectric switching memory application. Generally, it is desirable that the "P" and "N" curves are well-separated from the "U" and "D" curves, respectively, which provides a large signal in the standard architecture. It is also desirable that all the curves fall quickly to a low value; a curve that falls quickly indicates that the material completes the current flow, which produces the signal quickly. That is, it is a "fast switching" material. Generally, in the tests herein, the switching time is taken to be the time to fall to a value of 10% of the maximum amplitude, since this 10% level will generally be within the noise level of a typical integrated circuit.

Figure 12:
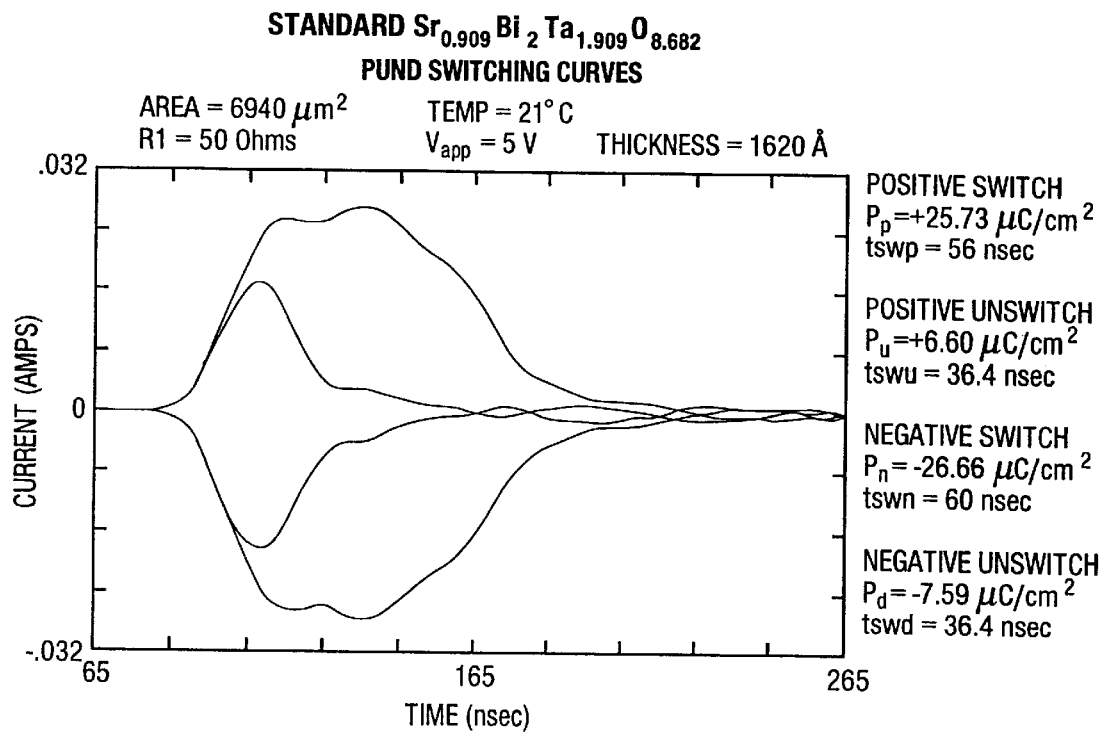
FIG. 12 depicts a graph of positive up negative down ("PUND") switching measurements obtained from a standard process strontium bismuth tantalate material, as current versus time.

FIG. 12 includes PUND switching curves for the standard process $Sr_{0.909}Bi_2Ta_{1.909}O_{8.682}$ $L_1$ and $L_2$ mixed sample, as a plot of current in amps versus an ordinate of time in nanoseconds. Measurements were obtained with a square wave oscillation frequency of 10,000 Hz using a voltage amplitude of 5V. These curves indicate that the ferroelectric material had a very quick memory switching time, with virtually complete memory switching being obtained in less than about 60 nanoseconds, even for the negative switching curves.

Figure 13:
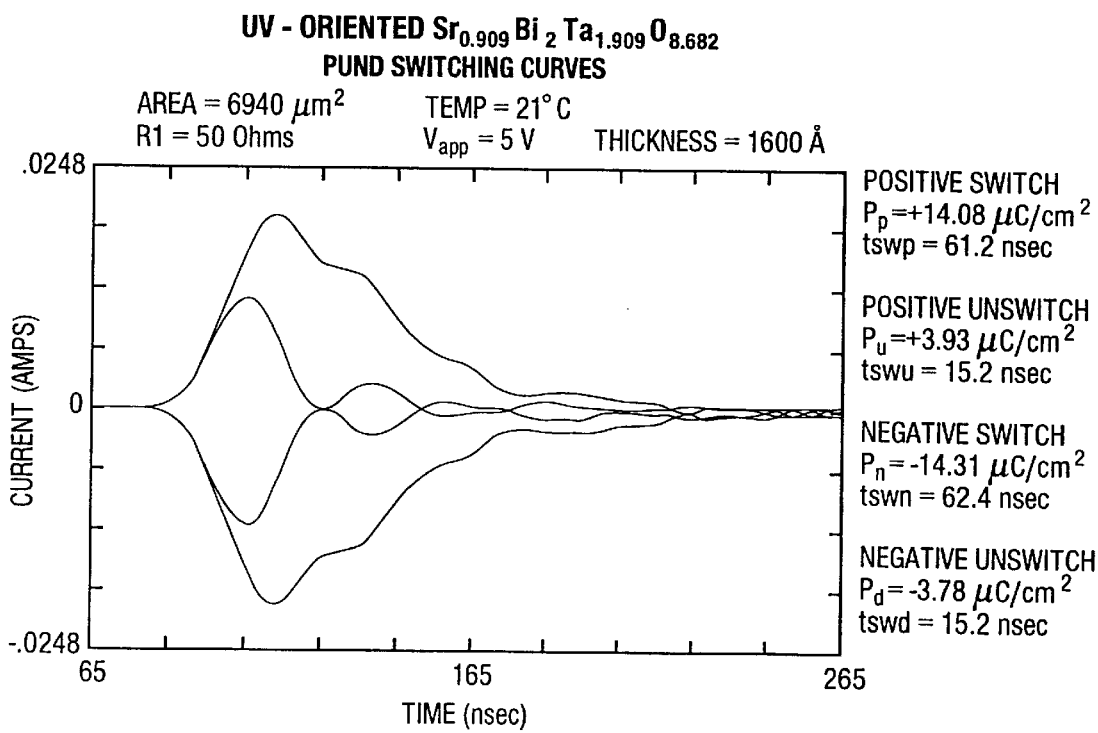
FIG. 13 depicts a graph like that of FIG. 12, but includes PUND switching data obtained from a UV oriented strontium bismuth tantalate material having the same stoichiometry as the sample of FIG. 12.

A UV oriented $Sr_{0.909}Bi_2Ta_{1.909}O_{8.682}$ sample was subjected to comparative PUND switching measurements. FIG. 13 depicts these PUND results. The memory switching time was extremely quick, with switching being obtained in less than about 62 nanoseconds even for the negative switching cycles. The observed switching times for both samples fell well within acceptable limits for use in integrated circuit memories.

EXAMPLE 14

Comparative Fatigue Endurance Measurements

Figure 14:
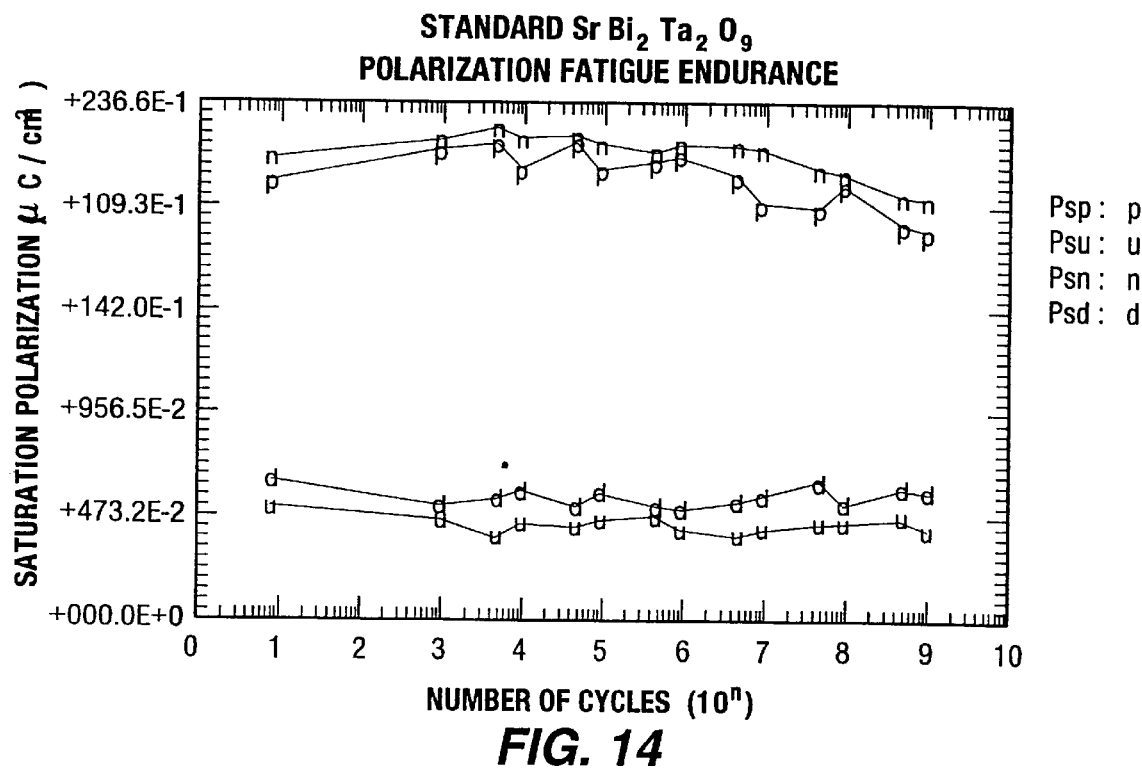
FIG. 14 depicts a polarization fatigue endurance curve as saturation polarization versus switching cycles for PUND measurements that were obtained from a standard process strontium bismuth tantalate material.

PUND switching measurements identical to those of Example 13 were repeated for $10^9$ cycles on respective standard process and UV oriented samples of $SrBi_2Ta_2O_9$ and $Sr_{0.909}Bi_2Ta_{1.909}O_{8.682}$ materials. FIG. 14 is a plot of saturation polarization in $\mu C/cm^2$ versus a logarithmic scale of switching cycles, and depicts data that was obtained from the standard process $SrBi_2Ta_2O_9$ sample. The four curves are labeled with p, u, n, or d to denote the corresponding portion of the PUND switching cycle from which the respective curves derive. The p and n curves exhibit substantial declines of 12% and 7%, respectively, over $10^9$ cycles. This level of fatigue indicates that the polarization of the standard process sample is extremely unstable under the switching conditions, and would be unsuitable for use as a memory material if these conditions would prevail in the intended environment of use.

Figure 15:
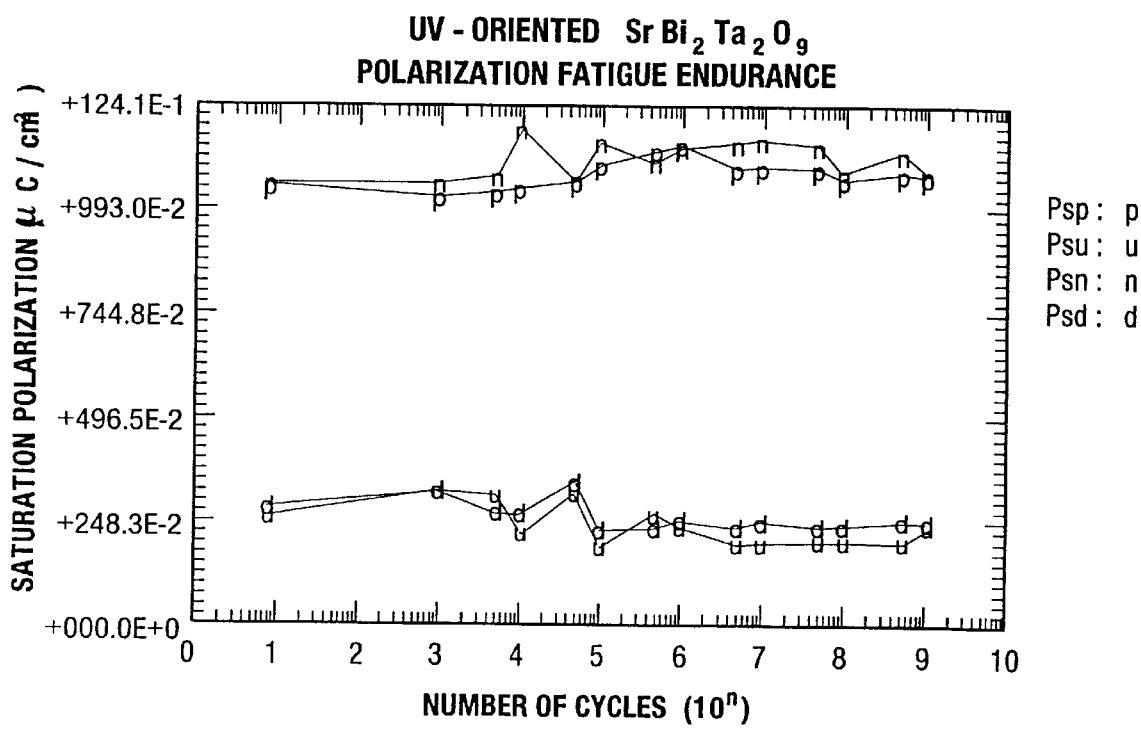
FIG. 15 depicts a PUND graph like that of FIG. 14, but includes polarization fatigue measurements obtained form a UV oriented sample having the same stoichiometry as the sample of FIG. 14.

FIG. 15 is a fatigue endurance plot like that of FIG. 14, but depicts results that were obtained form the UV oriented $SrBi_2Ta_2O_9$ sample. FIG. 15 indicates that essentially no fatigue occurred in the UV oriented sample over $10^9$ cycles. Accordingly, the UV oriented sample would be suitable for use as a memory material under the prevailing conditions.

Figure 16:
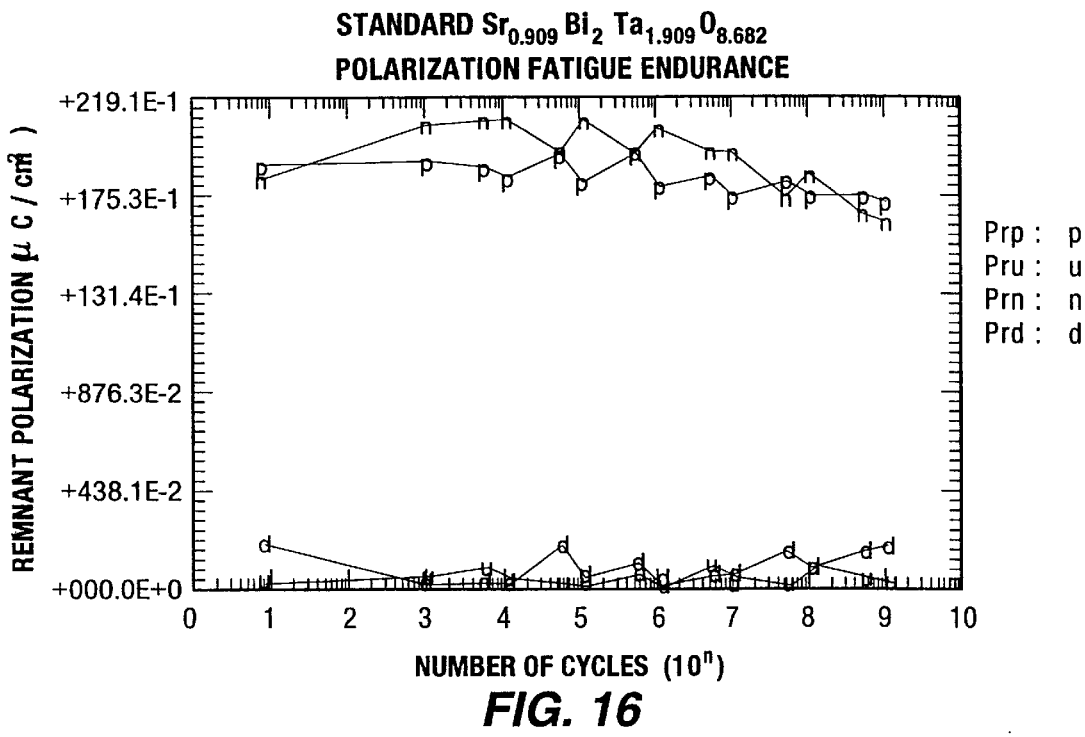
FIG. 16 depicts a PUND graph like that of FIGS. 14 and 15, but includes fatigue endurance data obtained from a standard process strontium bismuth tantalate material having a different stoichiometry than the samples of FIGS. 14 and 15.

FIG. 16 is a plot like that of FIGS. 14 and 15, but depicts results that were obtained from a standard process $Sr_{0.909}Bi_2Ta_{1.909}O_{8.682}$ sample. The curve exhibited an approximate 11% decline and the n curve a 14% decline over $10^9$ cycles. This material, accordingly, would not be suitable for use as a memory material under the prevailing conditions.

Figure 17:
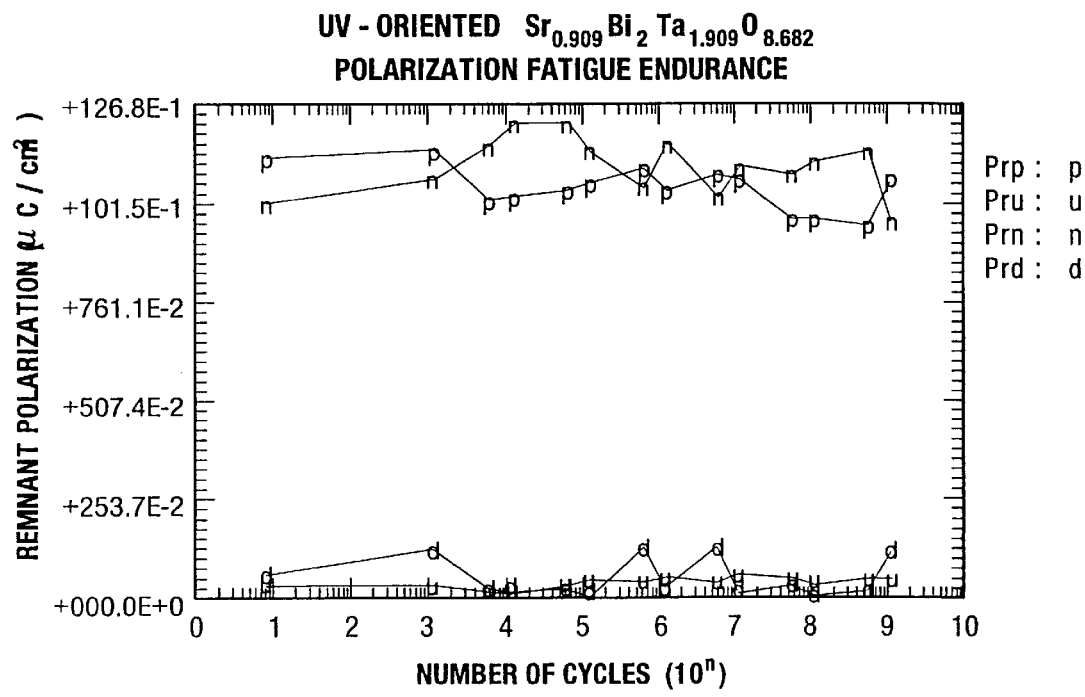
FIG. 17 depicts a PUND graph like that of FIGS. 14, 15, and 16, but includes data obtained from a UV oriented sample having the same stoichiometry as that of the FIG. 16 sample.

FIG. 17 is a plot like that of FIGS. 14, 15, and 16, but depicts data obtained from the UV oriented $Sr_{0.909}Bi_2Ta_{8.682}$ sample. The p and n curves exhibit substantially no fatigue within the limits of experimental accuracy over the cycle interval studied. Accordingly, this material would be suitable for use as a memory under the prevailing conditions.

EXAMPLE 15

The Effect of UV Annealing at Various Process Steps

Various $SrBi_2Ta_2O_9$ samples were made according to Example 9, except the drying and UV exposure conditions of step P28 (FIG. 2) were altered as described below. These procedures produced different samples that were designated MS1-N, MS1-L, MS2-N, MS2-L, MS3-N, MS3-L, MS4-N, and MS4-L. These samples were all produced from a single precursor solution having sufficient metal fractions to produce a metal oxide material having the average formula $SrBi_{2.18}Ta_{2.0}O_{9.27}$ in the absence of bismuth volatilization. The process conditions of step P28 are described below in Table 7. For example, the MS1-N and MS1-L samples were each subject to UV lighting for five minutes while drying at 150° C. and/or 270° C. The MS2-N and MS2-L were subjected to UV lighting during drying for 5 minutes at a temperature of 270° C. The MS1-L sample was also subjected to UV lighting before the first annealing step, as were the remainder of the MS*-L samples. These process conditions were substituted for the step P28 conditions of Example 9.

TABLE 7

STEP P28 VARIATIONS

| | UV Lighting | | |
|---|---|---|---|
| | During Drying | | Before |
| Sample # | 150° 5 minutes | 270° 5 minutes | Annealing 5 minutes |
| MS1-N | Y | Y | — |
| MS1-L | Y | Y | Y |
| MS2-N | — | Y | — |
| MS2-L | — | Y | Y |
| MS3-N | — | — | — |
| MS3-L | — | — | Y |
| MS4-N* | — | — | |
| MS4-L* | — | Y | |

*UV lighting was applied to the precursor (5 min., 150° C.) before spin-on.

The final samples were each subjected to measurements for the determination of thickness, dielectric constant of the thin-layer, 2Pr polarization at about 3 volts, and 2Ec at about 3 volts. These results are presented in Table 8 below.

TABLE 8

| Sample # | Thickness (Å) | Dielectric Constant* | 2Pr @ 3 V (uC/cm2) | 2Ec @ 3 V (kV/cm) |
|---|---|---|---|---|
| MS1-N | 1750 | 193 | 8.5 | 132 |
| MS1-L | 1750 | 192 | 8.4 | 132 |
| MS2-N | 1800 | 360 | 19.3 | 95.4 |
| MS2-L | 1800 | 364 | — | — |
| MS3-N | 1890 | 381 | 18.0 | 88.3 |
| MS3-L | 1890 | 379 | 18.3 | 87.6 |
| MS4-N* | 1870 | 367 | 17.0 | 90.8 |
| MS4-L* | 1870 | 375 | — | — |

*UV lighting was applied to the precursor (5 min., 150° C.) before spin-on.

The MS1-N and MS1-L samples had a dielectric constant of about one half the magnitude of the respective MS2, MS3, and MS4 samples. These samples also had significantly lower dielectric constants and a larger 2Ec than did the other samples. Accordingly, it is seen that UV application has a greater effect in the early drying stages of metal oxide formation than in other stages of step P28.

EXAMPLE 16

X-ray Diffraction Measurements

Figure 18:
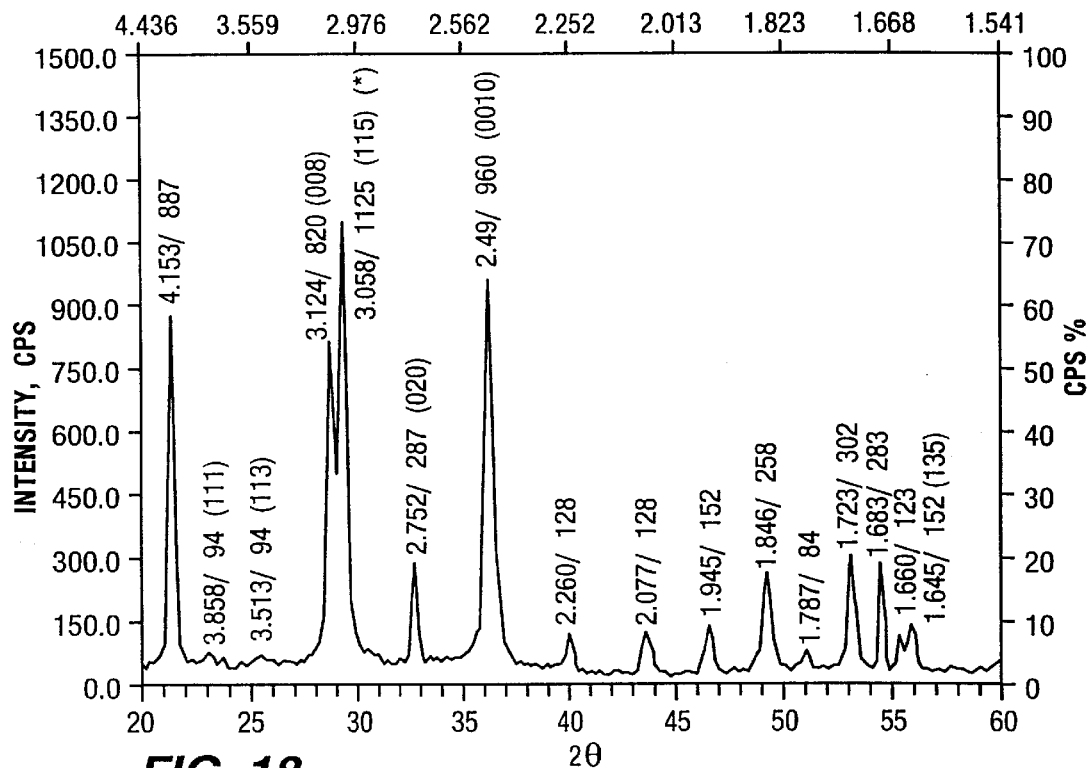
FIG. 18 depicts an X-ray diffraction analysis of a strontium bismuth tantalate material as a plot of intensity in counts per second versus twice the Bragg angle.
Figure 19:
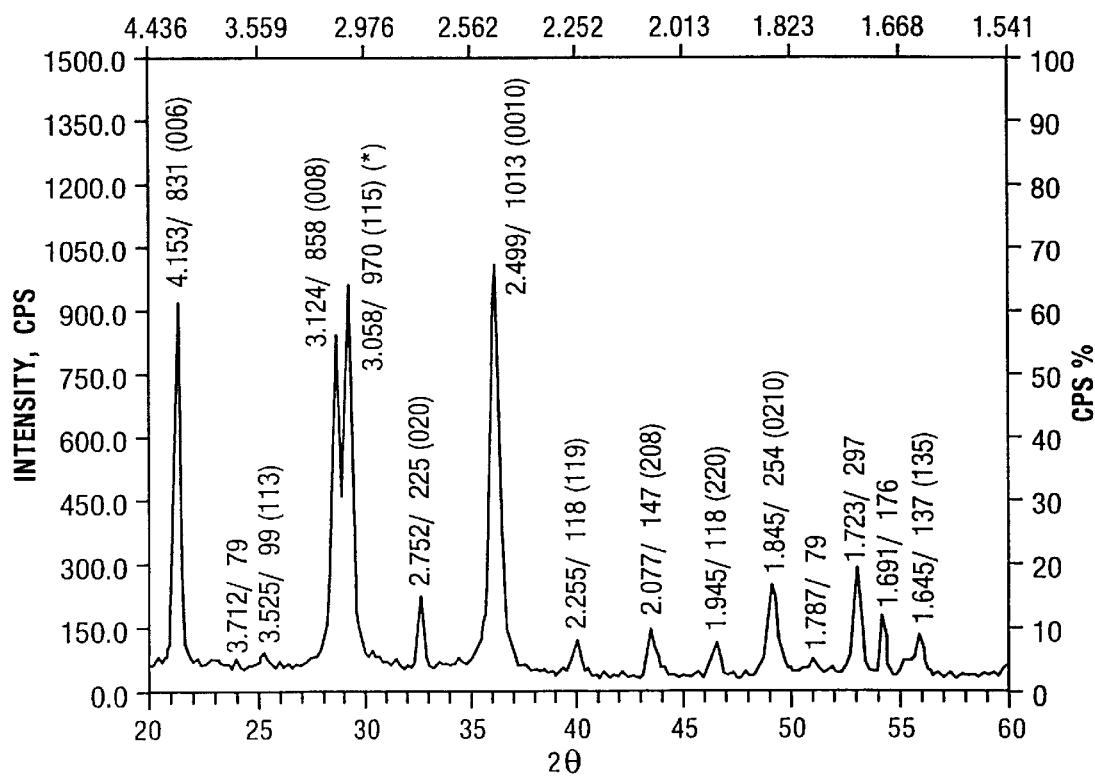
FIG. 19 depicts an X-ray diffraction plot like that of FIG. 18, but includes data from a strontium bismuth tantalate material of identical stoichiometry that was subjected to different UV lighting conditions in processing.

The respective $SrBi_{2.18}Ta_{2.0}O_{9.27}$ "MS" samples of Example 15 were subjected to conventional X-ray diffraction analysis, with FIGS. 18 through 22 depicting these results. Each of the FIGS. 18–22 is a plot of X-ray intensity as determined by a photodiode count of impinging radiation in counts per second ("CPS") versus twice the Bragg angle. The X-axis represents a circumferencial distance of the Bragg X-ray spectrometer, which has been converted to a value of two times the Bragg angle ("2Θ"). Each peak has been labeled with a distance corresponding to the 2Θ value, intensity count in counts per second and lattice point determination (in parentheses), which have been determined according to conventional techniques as will be understood by those skilled in the art. FIGS. 18 and 19 depict the results for the MS1-N and MS1-L samples, and are substantially identical with one another. This similarity indicates that the act of applying ultraviolet radiation prior to annealing the sample fails to produce substantial crystalline reorientation in superlattice materials when the UV application before anneal is conducted subsequent to having applied ultraviolet radiation during the drying step.

Figure 20:
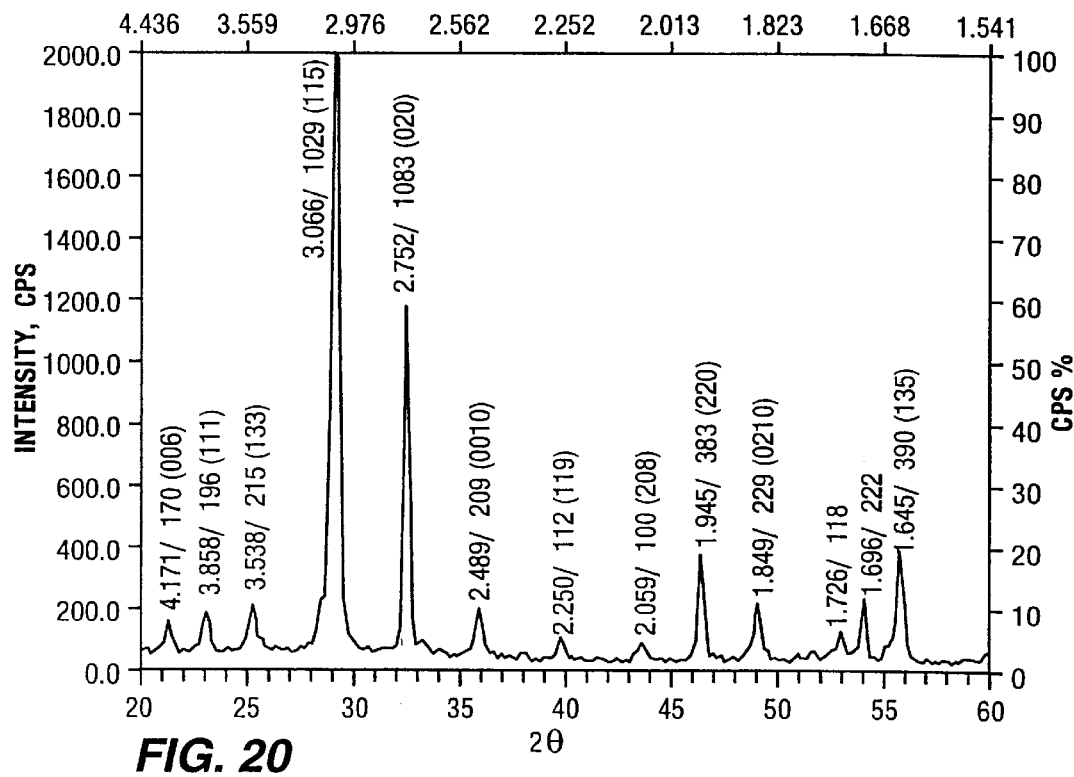
FIG. 20 depicts an X-ray diffraction plot like that of FIGS. 18 and 19, but includes data from a strontium bismuth tantalate material of identical stoichiometry that was subjected to further different UV lighting conditions in processing.
Figure 21:
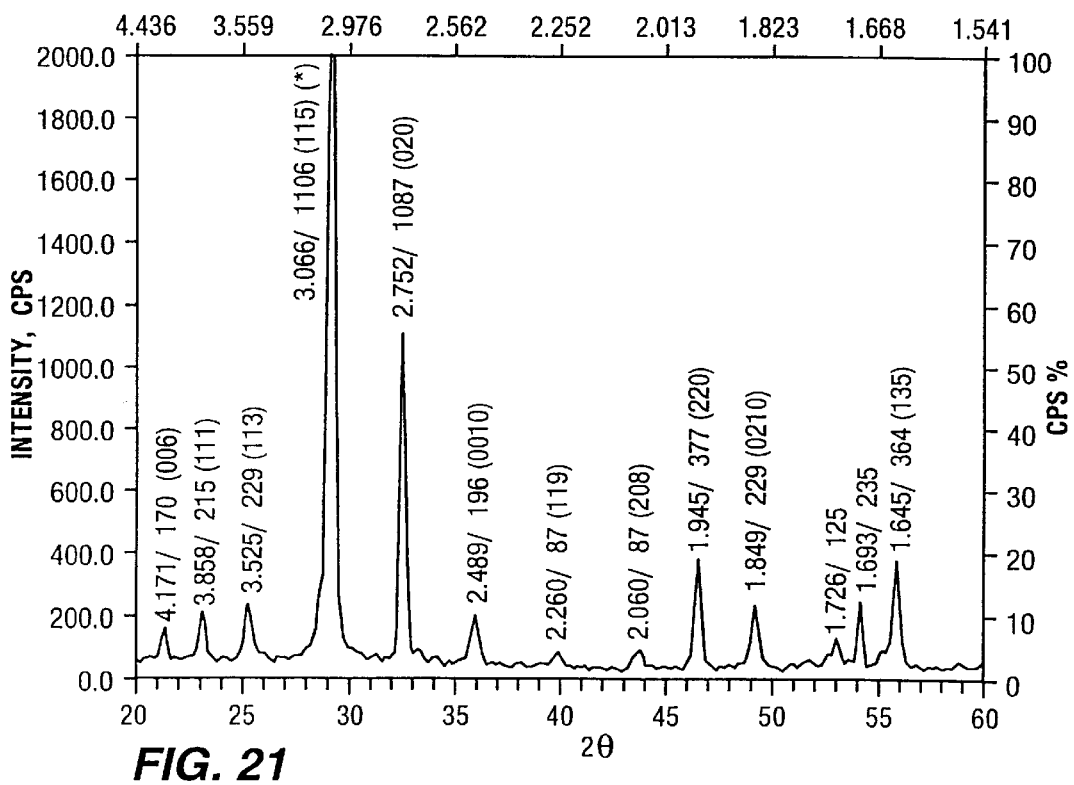
FIG. 21 depicts an X-ray diffraction plot like that of FIGS. 18, 19, and 20, but includes data from a strontium bismuth tantalate material of identical stoichiometry that was subjected to yet another set of UV lighting conditions in processing.
Figure 22:
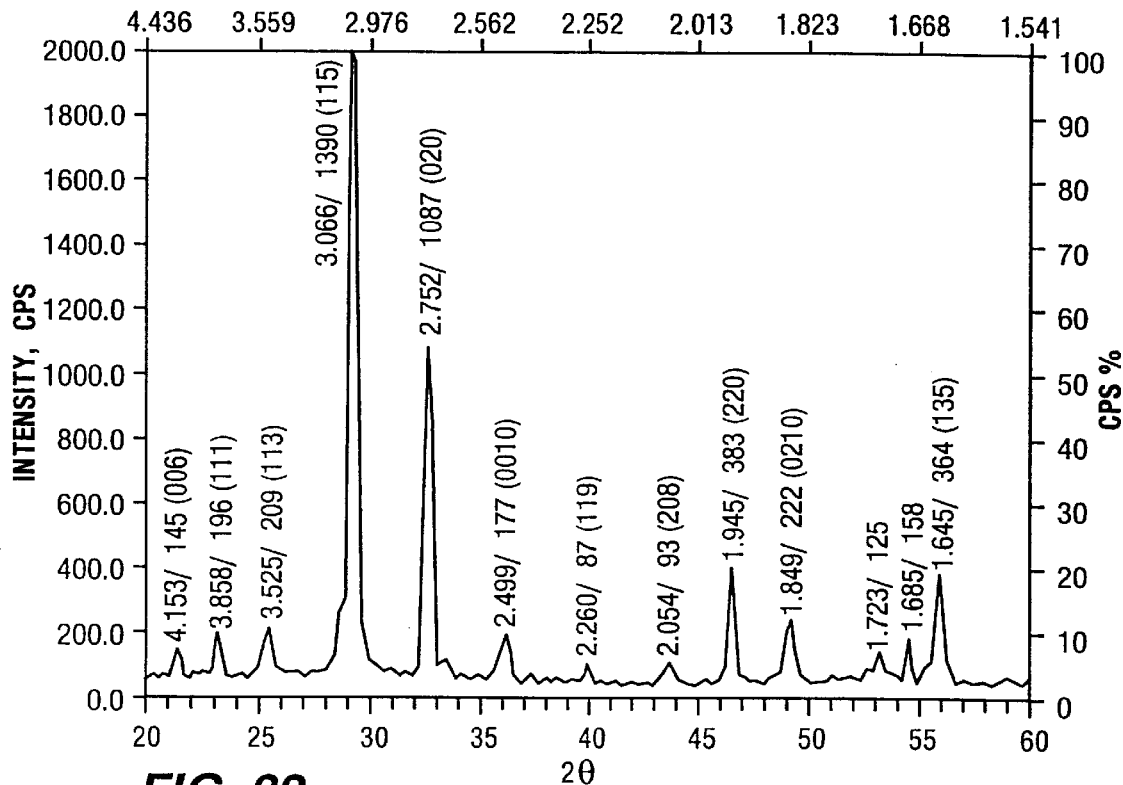
FIG. 22 depicts an X-ray diffraction plot like that of FIGS. 18, 19, 20, and 21, but includes data from a strontium bismuth tantalate material of identical stoichiometry that was subjected to yet another set of UV lighting conditions in processing.

FIGS. 20 (MS2-N), 21 (MS3-N) and 22 (MS4-N) depict substantial differences as compared with the MS1 samples. More specifically, the MS2-N, MS3-N and MS4-N samples, while very similar to each other, have marked differences in terms of peak intensity values as compared with the MS1-N sample. By way of example, the (006), (008), and (0010) lattice point peaks have a greater intensity in MS1-N (FIG. 18) than in MS3-N (FIG. 21); e.g., peak (006) has an intensity value of 887 in MS1-N and a peak intensity value of 170 in MS3-N. FIG. 18 also shows peak (020) having an intensity of 207, while FIG. 21 shows peak (020) having an intensity of 1087. The quantity 887/207 (FIG. 18) versus the quantity 170/1087 (FIG. 21) shows a greater relative abundance of lattice point (006) with respect to lattice point (020) in FIG. 18. Accordingly, UV radiation has induced lattice changes in these materials having identical stoichiometries. Similar relative abundance differences are apparent across peaks (008) and (0010). These values indicate that the MS1 samples have a greater c-axis grain orientation in the coordinate system (abc).

A mathematical analysis of the structure factors of FIGS. 18–21 indicates that the MS1-N and MS1-L samples have significant crystalline reorientations that are directed along the c-axis. This analysis is possible because the intensity of the diffracted radiation due to that incident on (HPL) planes with the proper Bragg angle may be calculated in a conventional manner as the square of the structure factor. This observation of an UV-induced orientation favoring the c-axis is confirmed by the fact that peak intensities for Miller Index values (111), (113), (020), and (135) are less abundant in sample MS1-N than in MS3-N, which received no UV radiation.

The combination of large differences in dielectric constant values, polarizability values, and field intensity values for these ferroelectric materials, in combination with evidence of crystalline reorientation along the c-axis, indicates that the ferroelectric domains within the crystalline grains have reoriented with the crystalline structure, thereby providing a UV-processed ferroelertric material having substantially different electrical properties as compared to a non-UV-processed or "standard" sample of the same average formulation.

EXAMPLE 17

Elimination of Carbon Impurities

Samples MS1-N and MS3-N of Example 15 were subjected to X-ray photoelectric spectroscopy ("XPS") analysis for purposes of determining whether any residual carbon impurities existed in the final sample materials. It should be understood that the XPS technique is only accurate within about ±20%. The results indicated that sample MS1 had an average formula of $C_4SrBi_{2.3}Ta_{3.4}O_{11.5}$, and the MS3-N sample had an average formula of $C_{9.6}SrBi_{2.4}Ta_{3.4}O_{10.7}$.

The MS1-N and MS3-N materials, respectively, were used as targets for light DC magnetron sputter deposition on a substrate. After sputtering, the MS1-N sample had an average formula of $SrBi_{1.5}Ta_{2.9}O_{9.5}$, and the MS3-N sample had an average formula of $C_{9.5}SrBi_{2.3}Ta_{3.3}O_{9.8}$.

These results indicated that the initial samples contained carbon impurities, which derived from the calcining of organic substituents during the drying and annealing process steps. The XPS technique was capable of analyzing only the surface of the materials, so sputtering was necessary to determine the interior carbon content of the initial samples. Sputtering was able to eliminate the carbon content in the MS1-N sample, which was the UV-dried starting material. Conversely, sputtering failed to remove carbon from the MS3-N sample, which was not exposed to UV radiation processing. Therefore, the high carbon content of the MS3-N sample pervaded the entire structure of the sample, as reflected in the carbon content of the sputtered material. Conversely, the MS1-N sample was relatively carbon free.

The extent to which the enhanced carbon content of the MS3-N sample is responsible for the increased polarization of the MS3-N sample is unknown, however, large concentrations of contaminants such as carbon in the superlattice induce point defects that accelerate irreversible fatigue damage as the polarization state is repeatedly switched. The fatigue measurements of Example 13 confirm these findings because the carbon contaminated samples exhibited poor fatigue endurance. Additionally, it is seen that the application of UV radiation was successful in eliminating carbon contaminants from the superlattice.

EXAMPLE 18

Capacitance Measurements

Figure 24:
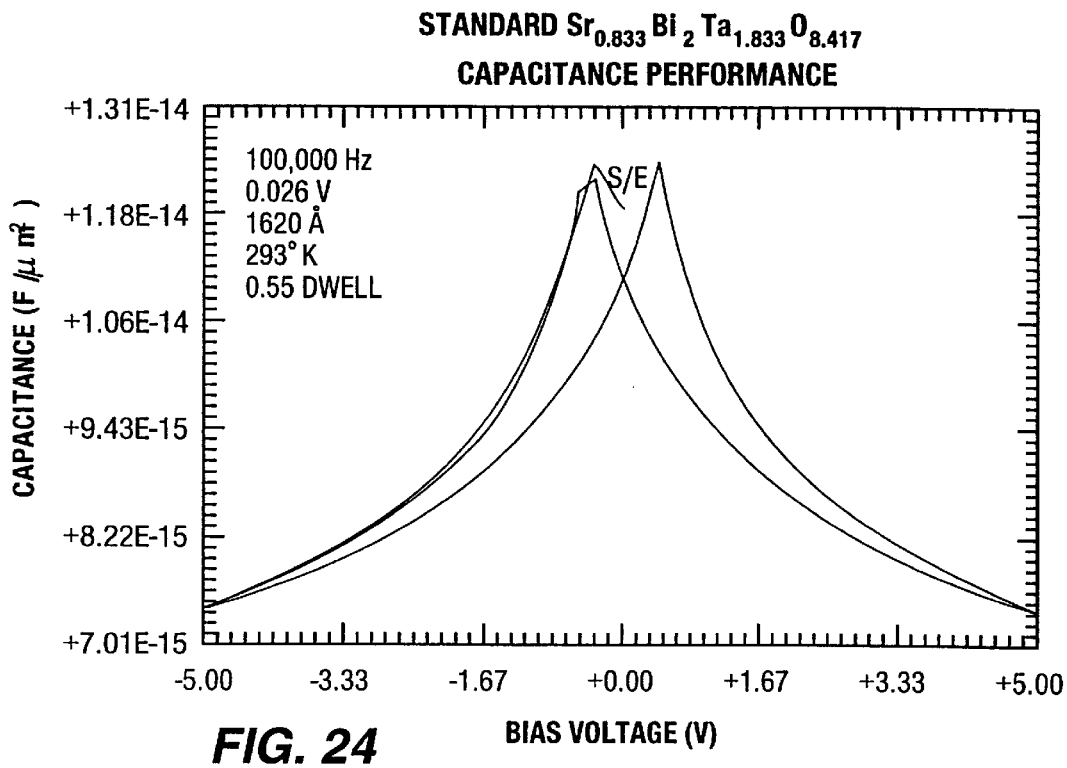
FIG. 24 depicts a plot of capacitance versus voltage for a standard process strontium bismuth tantalate sample.

A standard process $Sr_{0.909}Bi_2Ta_{1.909}O_{8.682}$ sample was operably connected to a Hewlet Packard 4275A LCR meter for purposes of conducting capacitance versus voltage measurements at 20° C. A sine wave function at a frequency of 100,000 Hz and an oscillation amplitude of 0.026V was modulated against a bias voltage ranging from −5 to 5V in stepped 0.200V increments. FIG. 24 depicts the results as a plot of capacitance in $F/\mu M^2$ versus bias voltage. Peak capacitance exceeded about $1.25 \times 10^{-14}$ $F/\mu m^2$ in the range around 0 V, and fell to about $7.5 \times 10^{-15}$ $F/\mu m^2$ in the 5V range. These results indicate a very high capacitance for a thin-film material.

Figure 25:
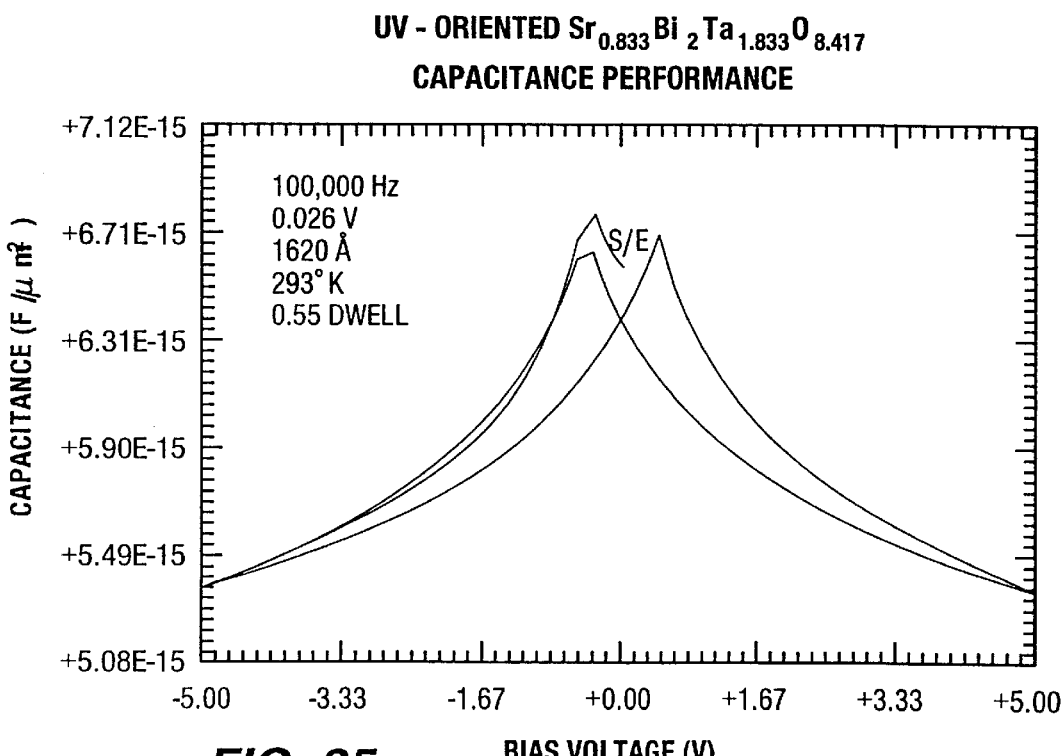
FIG. 25 depicts a capacitance plot like that of FIG. 23, but includes data obtained from a UV oriented strontium bismuth tantalate sample having an identical stoichiometry to the sample of FIG. 23.

A UV oriented $Sr_{0.909}Bi_2Ta_{1.909}O_{8.682}$ sample was subjected for comparative purposes to the same measurements as the standard process sample. FIG. 25 depicts the results. Peak capacitance exceeded about $7 \times 10^{-15}$ $F/\mu m^2$ in the range around 0 V, and fell to about $5.3 \times 10^{-15}$ $F/\mu M^2$ in the 5V range. The relatively lower capacitance of the UV oriented sample has specific advantages in DRAM circuits and the like. For example, a DRAM sense amplifier can be used to drive a bit line that serves as a common drain to several DRAM circuits. A capacitor is used to connect the bit line to ground, and other instances of parasitic capacitance exist in the associated circuitry. These capacitances require that the DRAM circuit must operate at a relatively greater voltage (and corresponding operating temperature), in order to overcome these capacitances. Use of the lower capacitance UV oriented sample could have advantages in reducing the required level of operating voltages.

There has been described a novel process utilizing ultraviolet radiation for fabricating metal oxide integrated circuit capacitors for use in digital memories, such as DRAMs. It should be understood that the particular embodiments shown in the drawings and described within this specification are for purposes of example and should not be construed to limit the invention. Further, it is evident that those skilled in the art may now make numerous uses and modifications of the specific embodiments described, without departing from the inventive concepts. The structures and processes may be combined with a wide variety of other structures and processes. Equivalent materials, different material thicknesses, and other methods of depositing the substrate and electrode layers may be used. It is also evident that the process steps recited may in some instances be performed in a different order, or equivalent structures and processes may be substituted for the various structures and processes described.

Those skilled in the art will understand that the preferred embodiments, as described hereinabove, may be subjected to apparent modifications without departing from the true scope and spirit of the invention. Accordingly, the inventors hereby declare their intention to rely upon the Doctrine of Equivalents, in order to protect their full rights in the invention.

What is claimed is:

1. A method of fabricating a low leakage current, thin-film metal oxide electrical component, said method comprising the steps of:

providing a substrate and a liquid precursor containing a plurality of metal moieties in effective amounts for yielding a metal oxide layered superlattice material upon annealing of said precursor, applying said liquid precursor onto said substrate to form a liquid thin film on said substrate;

drying by heating said liquid thin film on said substrate under conditions sufficient to form a dried metal oxide layered superlattice material thin film; and during said drying step, exposing said liquid thin film to an ultraviolet radiation source having an intensity sufficient to increase the c-axis orientation in said metal oxide layered superlattice material thin film; and thereafter annealing said dried metal oxide layered superlattice material thin-film to yield said metal oxide layered superlattice thin film.

2. The method as in claim 1 wherein said ultraviolet radiation is of a wavelength from about 180 nm to about 300 nm.

3. The method as in claim 2, wherein said ultraviolet radiation has an intensity of at least about 9 mW/cm² at 220 nm and 15 mW/cm² at 260 nm.

4. The method as in claim 1 wherein said drying step includes baking said substrate and said liquid thin film at a temperature ranging from about 120° C. to about 500° C. while exposing said liquid thin film to said ultraviolet radiation source.

5. The method as in claim 1 wherein said providing step includes a step of supplying said precursor as a polyoxyalkylated metal complex.

6. The method as in claim 5, wherein said polyoxyalkylated metal complex has a molecular formula

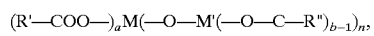

wherein M is a metal having an outer valence of (a+n) and M' is a metal having an outer valence of b, with M and M' preferably being independently selected from a group consisting of tantalum, calcium, bismuth, lead, yttrium, scandium, lanthanum, antimony, chromium, thallium, hafnium, tungsten, niobium, zirconium, vanadium, manganese, iron, cobalt, nickel, magnesium, molybdenum, strontium, barium, titanium, and zinc; R' is an alkyl group preferably having from 4 to 9 carbon atoms; and R is an alkyl group preferably having from 3 to 8 carbon atoms.

7. The method as in claim 1, wherein said layered superlattice material is a mixed layered superlattice material.

8. The method as in claim 1, wherein said layered superlattice material includes strontium bismuth tantalate.

9. The method as in claim 1, wherein said layered superlattice material is strontium bismuth niobium tantalate.

10. The method as in claim 1 wherein said drying step includes baking said liquid thin film at a temperature ranging from about 120° C. to 500° C.

11. The method as in claim 1 wherein said drying step comprises baking at about 400° C. for at least about 2 minutes in air.

12. The method as in claim 1 wherein said drying step includes a first baking of said liquid thin film at a temperature ranging from 120° C. to 500° C., and thereafter a step of applying UV radiation to said solid thin film.

13. The method as in claim 12 wherein said first baking is conducted at a temperature ranging from 120° C. to 160° C. in dry nitrogen or air.

14. The method as in claim 12 wherein said drying step further comprises a second baking step at a temperature ranging from about 240° C. to 280° C. after said applying step.

15. The wafer as set forth in claim 1 wherein said metal oxide layered superlattice material has a greater X-ray diffraction intensity peak at a Miller Index selected from the group of Miller indexes consisting of (0010) and (006) than at a Miller Index selected from the group consisting of (020) and (220).

16. The wafer as set forth in claim 1 wherein the ratio of the X-ray diffraction intensity at Miller Index (006) of said metal oxide layered superlattice material to the X-ray diffraction intensity at Miller Index (020) of said metal oxide layered superlattice material is at least 0.2.

17. The wafer as set forth in claim 16 wherein said ratio is at least 3.

18. The wafer as set forth in claim 1 wherein the ratio of the X-ray diffraction intensity at Miller Index (0010) of said metal oxide layered superlattice material to the X-ray diffraction intensity at Miller Index (220) of said metal oxide layered superlattice material is at least 1.0.

19. The wafer as set forth in claim 18 wherein said ratio is at least 5.

20. The wafer as set forth in claim 1 wherein said metal oxide layered superlattice material has a greater X-ray diffraction peak intensity at the Miller Index (006) than the sum of the X-ray diffraction peak intensity at the Miller Index (111) and the X-ray diffraction peak intensity at the Miller Index (113).

21. In a wafer of the type having a substrate and a thin-film metal oxide layered superlattice material, the improvement comprising said thin-film metal oxide layered superlattice material being deposited on said substrate by a process including the steps of:

applying a liquid precursor solution to said substrate, wherein said liquid precursor includes a plurality of metal moieties in effective amounts for yielding a metal oxide layered superlattice material upon annealing of said precursor;

drying by heating said liquid precursor solution to form a dried precursor film; and annealing said dried precursor film, said process further including a step of exposing said wafer to ultraviolet radiation during said step of drying said liquid precursor solution to increase the c-axis orientation in said metal oxide layered superlattice material derived from said process.

22. The wafer as set forth in claim 21 wherein said metal oxide layered superlattice material has a greater X-ray diffraction intensity peak at a Miller Index selected from the group of Miller indexes consisting of (0010) and (006) than at a Miller Index selected from the group consisting of (020) and (220).

23. The wafer as set forth in claim 21 wherein the ratio of the X-ray diffraction intensity at Miller Index (006) of said metal oxide layered superlattice material to the X-ray diffraction intensity at Miller Index (020) of said metal oxide layered superlattice material is at least 0.2.

24. The wafer as set forth in claim 23 wherein said ratio is at least 3.

25. The wafer as set forth in claim 21 wherein the ratio of the X-ray diffraction intensity at Miller Index (0010) of said metal oxide layered superlattice material to the X-ray diffraction intensity at Miller Index (220) of said metal oxide layered superlattice material is at least 1.0.

26. The wafer as set forth in claim 25 wherein said ratio is at least 5.

27. A method of fabricating a low leakage current, thin-film metal oxide electrical component, said method comprising the steps of:

providing a substrate and a liquid precursor containing a plurality of metal moieties in effective amounts for yielding a metal oxide layered superlattice material upon annealing of said precursor;

applying said liquid precursor onto said substrate to form a liquid thin film on said substrate;

drying by heating said liquid thin film on said substrate under conditions sufficient to form a dried metal oxide layered superlattice material thin film; and during said drying step, exposing said liquid thin film to an ultraviolet radiation source having an intensity sufficient so that said metal oxide layered superlattice material has a greater X-ray diffraction peak intensity at the Miller Index (006) than the sum of the X-ray diffraction peak intensity at the Miller Index (111) and the X-ray diffraction peak intensity at the Miller Index (113); and thereafter annealing said dried metal oxide layered superlattice material thin-film to yield said metal oxide layered superlattice thin film.

28. A method of fabricating a low leakage current, thin-film metal oxide electrical component, said method comprising the steps of:

providing a substrate and a liquid precursor containing a plurality of metal moieties in effective amounts for yielding a metal oxide layered superlattice material upon annealing of said precursor;

applying said liquid precursor onto said substrate to form a liquid thin film on said substrate;

drying said liquid thin film on said substrate under conditions sufficient to form a dried metal oxide layered superlattice material thin film, wherein said step of drying said liquid thin film includes exposing said liquid thin film to an ultraviolet radiation source having an intensity sufficient to increase the c-axis orientation in said metal oxide layered superlattice material thin film simultaneously with heating at a temperature ranging from about 120° to 270° C. in dry nitrogen or air; and thereafter annealing said dried metal oxide layered superlattice material thin-film to yield said metal oxide layered superlattice thin film.

* * * * *

UNITED STATES PATENT AND TRADEMARK OFFICE
CERTIFICATE OF CORRECTION

PATENT NO : 6,133,050
DATED : October 17, 2000
INVENTOR(S) : Masamichi Azuma, et al.

It is certified that error appears in the above-identified patent and that said Letters Patent is hereby corrected as shown below:

On title page, item 63 Related U.S. Application Data
 replace "Continuation-in-part of application No. 07/965,190, Oct. 23, 1992, abandoned, and a continuation-in-part of application No. 07/993,380, Dec. 18, 1992"
 with --Continuation-in-part of application No. 07/965,190, Oct. 23, 1992, abandoned, and a continuation-in-part of application No. 07/993,380, Dec. 18, 1992, and a continuation-in-part of application No. 08/224,241, Apr. 7, 1994, now U.S. Patent No. 5,523, 964, June 4, 1996--.

Signed and Sealed this

Twenty-second Day of May, 2001

*Attest:*

NICHOLAS P. GODICI

*Attesting Officer*   Acting Director of the United States Patent and Trademark Office